United States Patent
Kondo et al.

(10) Patent No.: US 7,737,472 B2
(45) Date of Patent: Jun. 15, 2010

(54) SEMICONDUCTOR INTEGRATED CIRCUIT DEVICE

(75) Inventors: Hideaki Kondo, Kyoto (JP); Toshiyuki Moriwaki, Osaka (JP); Masaki Tamaru, Kyoto (JP); Takashi Andoh, Shiga (JP)

(73) Assignee: Panasonic Corporation, Osaka (JP)

( * ) Notice: Subject to any disclaimer, the term of this patent is extended or adjusted under 35 U.S.C. 154(b) by 279 days.

(21) Appl. No.: 12/061,947

(22) Filed: Apr. 3, 2008

(65) Prior Publication Data

US 2008/0246091 A1   Oct. 9, 2008

(30) Foreign Application Priority Data

Apr. 5, 2007   (JP) .............................. 2007-099422
Sep. 10, 2007  (JP) .............................. 2007-233650

(51) Int. Cl.
  *H01L 29/72*   (2006.01)
(52) U.S. Cl. .................. 257/206; 257/204; 257/288; 257/369; 716/8
(58) Field of Classification Search .................. 257/204, 257/206, 288, 369; 716/8
See application file for complete search history.

(56) References Cited

U.S. PATENT DOCUMENTS

| | | | | |
|---|---|---|---|---|
| 6,987,293 | B2 * | 1/2006 | Sakamoto et al. | 257/202 |
| 7,132,323 | B2 | 11/2006 | Haensch et al. | |
| 2007/0141766 | A1 * | 6/2007 | Sekido et al. | 438/154 |

FOREIGN PATENT DOCUMENTS

| | | |
|---|---|---|
| JP | 2003-133416 | 5/2003 |
| JP | 2007-165670 | 6/2007 |

* cited by examiner

*Primary Examiner*—Edward Wojciechowicz
(74) *Attorney, Agent, or Firm*—McDermott Will & Emery LLP

(57) ABSTRACT

A semiconductor integrated circuit device capable of suppressing variations in transistor characteristics due to the well proximity effect is provided. Standard cell rows are arranged in a vertical direction, each standard cell row including standard cells arranged in a horizontal direction. In the standard cell rows, positions of the N well and the P region in the vertical direction are switched every other row. Adjacent standard cell rows share the P region or the N well. A distance from a PMOS transistor located at an end of a standard cell row to an end of an N well is greater than or equal to a width of an N well shared by standard cell rows.

29 Claims, 35 Drawing Sheets

FIG. 19A  block P
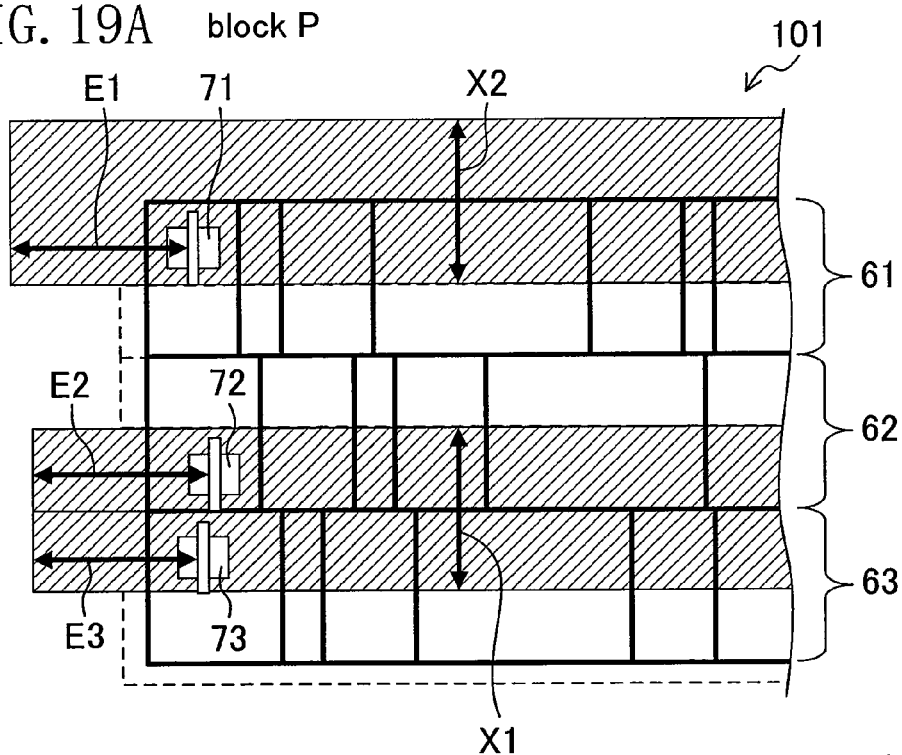
FIG. 19B  block Q
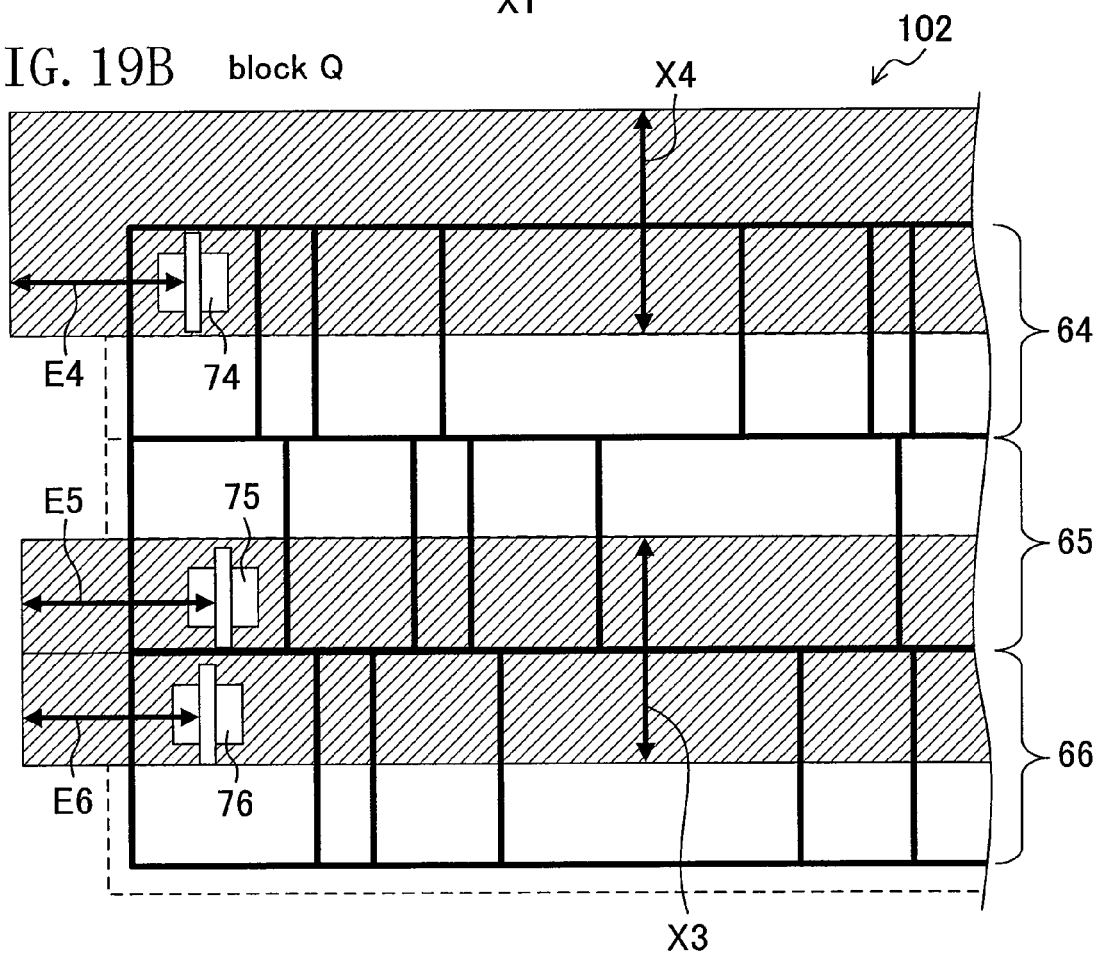

FIG. 46A  block P
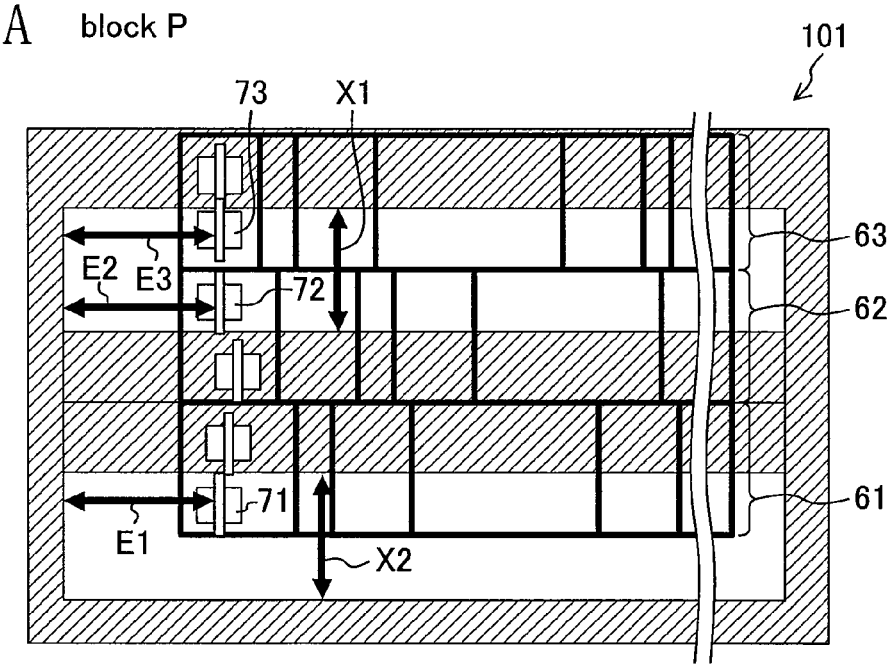
FIG. 46B  block Q
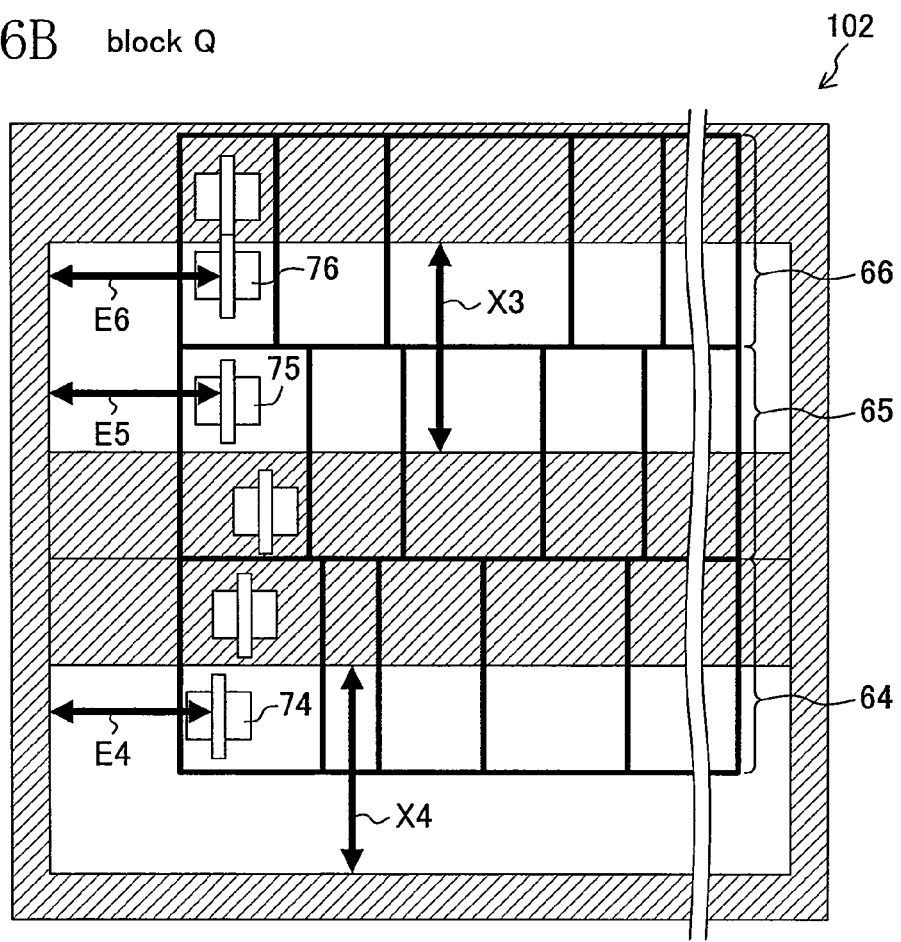

SEMICONDUCTOR INTEGRATED CIRCUIT DEVICE

CROSS REFERENCE TO RELATED APPLICATIONS

This Non-provisional application claims priority under 35 U.S.C. §119(a) on Patent Application No. 2007-099422 filed in Japan on Apr. 5, 2007 and Patent Application No. 2007-233650 filed in Japan on Sep. 10, 2007, the entire contents of which are hereby incorporated by reference.

BACKGROUND OF THE INVENTION

1. Field of the Invention

The present invention relates to a technique for designing the layout of a semiconductor integrated circuit and, more particularly, to a semiconductor integrated circuit device designed by arranging standard cells.

2. Description of the Related Art

Conventionally, the layout of a semiconductor integrated circuit is designed by arranging circuit components called standard cells. For example, standard cells are arranged in a horizontal direction to form a standard cell row, and a plurality of standard cell rows are arranged in a vertical direction to form a circuit block. Each standard cell has a PMOS transistor and an NMOS transistor. In the N-well structure, the PMOS transistor is formed on an N well and the NMOS transistor is formed on a P substrate. In the twin-well structure, the PMOS transistor is formed on an N well and the NMOS transistor is formed on a P well.

Also, in order to achieve low power consumption required by recent mobile apparatuses, a standard cell block is formed on a triple well so that a power supply control technique or a substrate control technique is applied. In the triple-well structure, the PMOS transistor is formed on an N well and the NMOS transistor is formed on a P well, and the N well and the P well are formed on a triple-well that is a deep N well. In addition, the P well is separated from a P substrate by the triple-well. FIG. 48 schematically shows the triple-well structure.

Patent Document 1: Japanese Unexamined Patent Application Publication No. 2003-133416

Patent Document 2: Japanese Unexamined Patent Application Publication No. 2007-165670

With the development of even smaller microstructures, a phenomenon called a well proximity effect is more likely to occur. The well proximity effect is a phenomenon such that, when impurities are implanted into a well, the impurities are reflected and scattered from a resist and are then implanted into a channel region of a transistor, so that the impurity concentration of the channel exceeds a set value, resulting in an increase in threshold value of the transistor.

The impurity implantation amount due to the reflection and scattering differs, depending on a space between the transistor and the well, and tends to increase with a decrease in the space. The space between the transistor and the well as used herein corresponds to a distance from the transistor to an end of the well. In smaller microstructures, the space between the transistor and the well (layout rule) is further narrowed, so that the well proximity effect is more likely to occur as a side effect.

Typically, in the step of logic design of an electronic circuit, it is assumed that the same cells have the same characteristics. However, when the space between a transistor and a well differs on the layout, the transistor characteristics of a product may differ due to the influence of the well proximity effect. Therefore, there is a mismatch between the design and the product in terms of circuit operation timing or the like, resulting in a defective product. In addition, a decrease in yield, a decrease in circuit performance due to addition of a design margin for securing a difference in characteristics, and an increase in block area lead to a reduction in competitiveness.

On the other hand, in order to cause the same cells to have the same characteristics, the space between the transistor and the well needs to be constant or be broadened to an extent that can prevent reflected and scattered impurities from reaching so the influence of the well proximity effect is negligible.

An exemplary portion where variations in characteristics due to the well proximity effect occur is an end portion of a standard cell row. Specifically, the space between a transistor and a well is considerably large in the vicinity of a center of a cell row since a cell is interposed between adjacent cells on both sides thereof, whereas there is only a space having a well width included in a single cell at an end portion of a cell row. Therefore, a difference occurs in characteristics.

Also, a difference in characteristics is likely to occur at the uppermost or lowermost standard cell row. In a typical semiconductor integrated circuit designed using standard cells, every other standard cell row is flipped, and two vertically adjacent standard cell rows share a well region. In other words, the width of a well region is broad with the exception of the uppermost row or the lowermost row. Therefore, the uppermost or lowermost standard cell row has a smaller well width than those of the other portions, so that a difference in characteristics occurs therein.

The above-described problem has become significant with the development of even smaller microstructures. Conventionally, no measures in which the influence of the well proximity effect and the space between a transistor and a well are taken into consideration have not been taken in layout design.

SUMMARY OF THE INVENTION

An object of the present invention is to provide a semiconductor integrated circuit device in which variations in transistor characteristics due to the well proximity effect can be suppressed.

According to a first embodiment of the present invention, a semiconductor integrated circuit device comprises a circuit block including a plurality of standard cell rows arranged in a vertical direction, each standard cell row including standard cells arranged in a horizontal direction. Each of the standard cell rows includes an N well and a P region extending in the horizontal direction and adjacent to each other in the vertical direction. Each of the standard cells has a PMOS transistor formed in the N well and an NMOS transistor formed in the P region. In the standard cell rows, positions of the N well and the P region in the vertical direction are switched every other row, the first and second standard cell rows share the P region, and the second and third standard cell rows share the N well. In at least one of the standard cell rows, a distance from a PMOS transistor located at least one end thereof to an end closer to the PMOS transistor in the horizontal direction of the N well is greater than or equal to a shared-N well width which is a width in the vertical direction of the N well shared by the second and third standard cell rows.

In the first embodiment of the present invention, in at least one of the standard cell rows, the distance from a PMOS transistor located at least one end thereof to an end closer to the PMOS transistor in the horizontal direction of the N well is greater than or equal to the shared-N well width which is a width in the vertical direction of the N well shared by the second and third standard cell rows. Therefore, the well proximity effect at an end portion of a standard cell row can be suppressed, so that a difference in characteristics between a transistor located at the end of the standard cell row and transistors located elsewhere can be suppressed.

According to a second embodiment of the present invention, a semiconductor integrated circuit device comprises a circuit block including a plurality of standard cell rows arranged in a vertical direction, each standard cell row including standard cells arranged in a horizontal direction. Each of the standard cell rows includes an N well and a P region extending in the horizontal direction and adjacent to each other in the vertical direction. Each of the standard cells has a PMOS transistor formed in the N well and an NMOS transistor formed in the P region. In the standard cell rows, positions of the N well and the P region in the vertical direction are switched every other row, the first and second standard cell rows share the P region, and the second and third standard cell rows share the N well. In addition, a width in the vertical direction of the N well in the first standard cell row is greater than or equal to a shared-N well width which is a width in the vertical direction of the N well shared by the second and third standard cell rows, and each of the standard cells has a width in the vertical direction of the N well greater than or equal to the shared-N well width. Alternatively, a dummy cell row having dummy cells arranged in the horizontal direction, each dummy cell having an N well, is arranged closer to the outside than the first standard cell row with the N well being shared with the dummy cell row and the first standard cell row, and a width in the vertical direction of the N well shared by the first standard cell row and the dummy cell row is greater than or equal to a shared-N well width which is a width in the vertical direction of the N well shared by the second and third standard cell rows.

In the second embodiment of the present invention, the width in the vertical direction of the N well in the first standard cell row is greater than or equal to the shared-N well width which is a width in the vertical direction of the N well shared by the second and third standard cell rows. Therefore, the well proximity effect in the first standard cell row can be suppressed to the same extent to which the well proximity effect in the second and third standard cell rows is suppressed. A difference in characteristics between transistors in the first standard cell row and transistors in the second and third standard cell rows can be suppressed.

According to a third embodiment of the present invention, a semiconductor integrated circuit device comprises a circuit block including a plurality of standard cell rows arranged in a vertical direction, each standard cell row including standard cells arranged in a horizontal direction. Each of the standard cell rows includes an N well and a P well extending in the horizontal direction and adjacent to each other in the vertical direction. Each of the standard cells has a PMOS transistor formed in the N well and an NMOS transistor formed in the P well. In the standard cell rows, positions of the N well and the P well in the vertical direction are switched every other row, the first and second standard cell rows share the N well, and the second and third standard cell rows share the P well. In at least one of the standard cell rows, a distance from an NMOS transistor located at least one end thereof to an end closer to the NMOS transistor in the horizontal direction of the P well is greater than or equal to a shared-P well width which is a width in the vertical direction of the P well shared by the second and third standard cell rows.

In the third embodiment of the present invention, in at least one of the standard cell rows, the distance from an NMOS transistor located at least one end thereof to an end closer to the NMOS transistor in the horizontal direction of the P well is greater than or equal to the shared-P well width which is a width in the vertical direction of the P well shared by the second and third standard cell rows. Therefore, the well proximity effect at an end portion of a standard cell row can be suppressed, so that a difference in characteristics between a transistor located at the end of the standard cell row and transistors located elsewhere can be suppressed.

According to a fourth embodiment of the present invention, a semiconductor integrated circuit device comprises a circuit block including a plurality of standard cell rows arranged in a vertical direction, each standard cell row including standard cells arranged in a horizontal direction. Each of the standard cell rows includes an N well and a P well extending in the horizontal direction and adjacent to each other in the vertical direction. Each of the standard cells has a PMOS transistor formed in the N well and an NMOS transistor formed in the P well. In the standard cell rows, positions of the N well and the P well in the vertical direction are switched every other row, the first and second standard cell rows share the N well, and the second and third standard cell rows share the P well. In addition, a width in the vertical direction of the P well in the first standard cell row is greater than or equal to a shared-P well width which is a width in the vertical direction of the P well shared by the second and third standard cell rows, and each of the standard cells has a width in the vertical direction of the P well greater than or equal to the shared-P well width. Alternatively, a dummy cell row having dummy cells arranged in the horizontal direction, each dummy cell having a P well, is arranged closer to the outside than the first standard cell row with the P well being shared with the dummy cell row and the first standard cell row, and a width in the vertical direction of the P well shared by the first standard cell row and the dummy cell row is greater than or equal to a shared-P well width which is a width in the vertical direction of the P well shared by the second and third standard cell rows.

In the fourth embodiment of the present invention, the width in the vertical direction of the P well in the first standard cell row is greater than or equal to the shared-P well width which is a width in the vertical direction of the P well shared by the second and third standard cell rows. Therefore, the well proximity effect in the first standard cell row can be suppressed to the same extent to which the well proximity effect in the second and third standard cell rows is suppressed. A difference in characteristics between transistors in the first standard cell row and transistors in the second and third standard cell rows can be suppressed.

As described above, according to the present invention, variations in transistor characteristics due to the well proximity effect can be suppressed.

BRIEF DESCRIPTION OF THE DRAWINGS

FIGS. 19A and 19B are diagrams showing detailed layouts of circuit blocks of FIG. 18.

FIGS. 46A and 46B are diagrams showing detailed layouts of circuit blocks of FIG. 45.

DETAILED DESCRIPTION OF THE PREFERRED EMBODIMENTS

Hereinafter, embodiments of the present invention will be described with reference to the accompanying drawings.

Note that, as used herein, a direction in which standard cells are arranged in a standard cell row is referred to as a horizontal direction, and a direction in which standard cell rows are arranged is referred to as a vertical direction, for the sake of convenience.

First Embodiment

Figure 1:
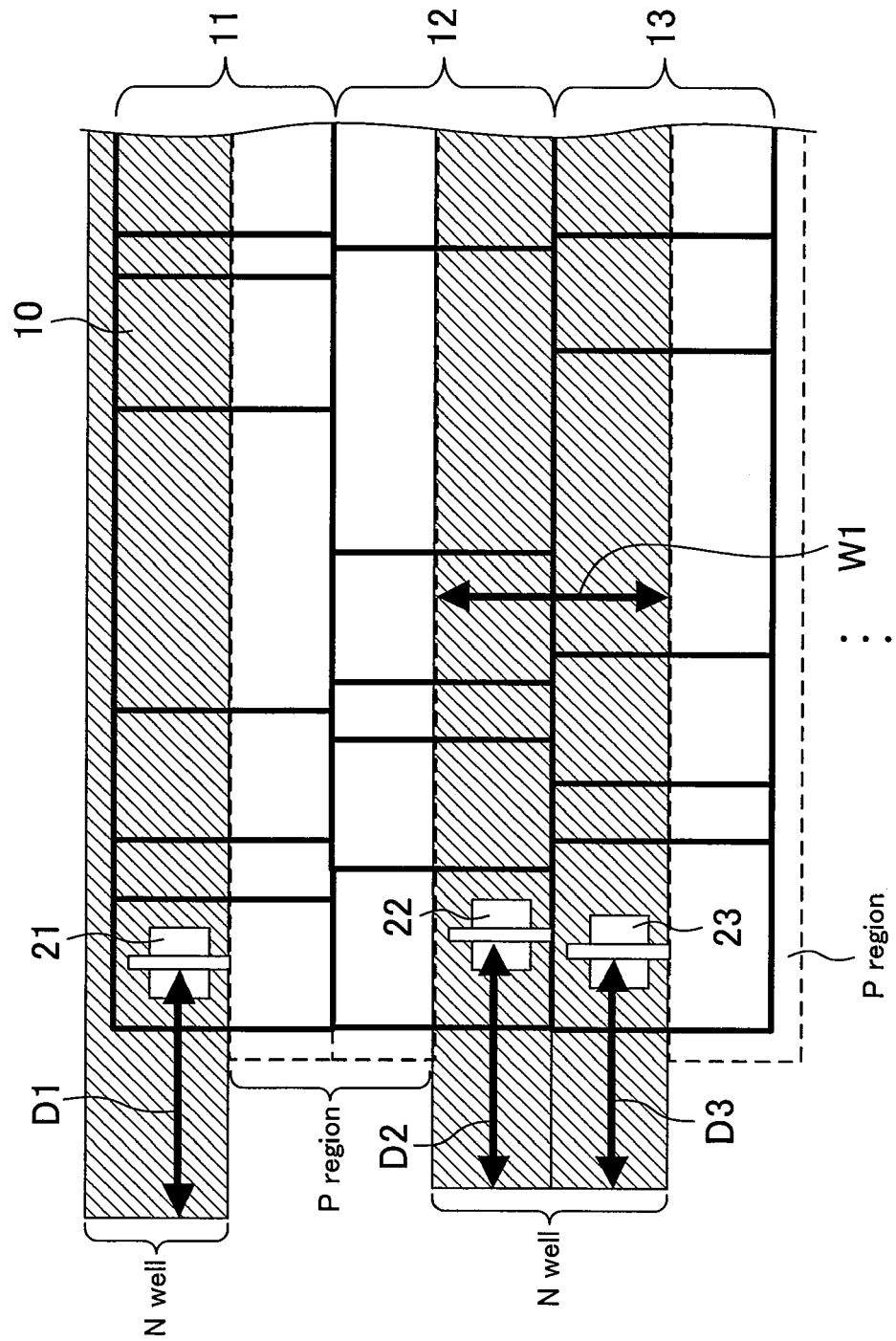
FIG. 1 is a diagram showing a portion of a layout of a semiconductor integrated circuit device according to a first embodiment of the present invention.

FIG. 1 is a diagram showing a portion of a layout of a semiconductor integrated circuit device according to a first embodiment of the present invention. In FIGS. 1, 11, 12 and 13 indicate standard cell rows in which standard cells 10 (illustrated with rectangles) are arranged in the horizontal direction. The standard cell rows 11, 12, 13, . . . are arranged in the vertical direction to form a circuit block. The standard cell row 11 is the uppermost row. Each of the standard cell rows 11, 12 and 13 includes an N well and a P region which extend in the horizontal direction and are adjacent to each other in the vertical direction. Each standard cell 10 has a PMOS transistor formed in the N well and an NMOS transistor formed in the P region. Note that transistors other than PMOS transistors 21, 22 and 23 are not shown.

The semiconductor integrated circuit device of FIG. 1 has an N-well structure in which PMOS transistors are formed on an N well and NMOS transistors are formed on a P substrate, or a twin-well structure in which PMOS transistors are formed on an N well and NMOS transistors are formed on a P well. The P region of FIG. 1 is a P substrate in the case of the N-well structure and a P well in the case of the twin-well structure.

In the standard cell rows 11, 12 and 13, positions in the vertical direction of the N well and the P region are switched every other row. Specifically, the standard cell row 12 is flipped. Also, as viewed from the top, the first and second standard cell rows 11 and 12 share the P region, and the second and third standard cell rows 12 and 13 share the N well.

Also, in FIG. 1, the PMOS transistors 21, 22 and 23 are located at left ends of the N wells of the standard cell rows 11, 12 and 13, respectively. D1 indicates a distance from the PMOS transistor 21 to an end closer thereto in the horizontal direction of the N well, D2 indicates a distance from the PMOS transistor 22 to an end closer thereto in the horizontal direction of the N well, and D3 indicates a distance from the PMOS transistor 23 to an end closer thereto in the horizontal direction of the N well. W1 indicates a width (shared-N well width) in the vertical direction of the N well shared by the second and third standard cell rows 12 and 13.

Figure 26:
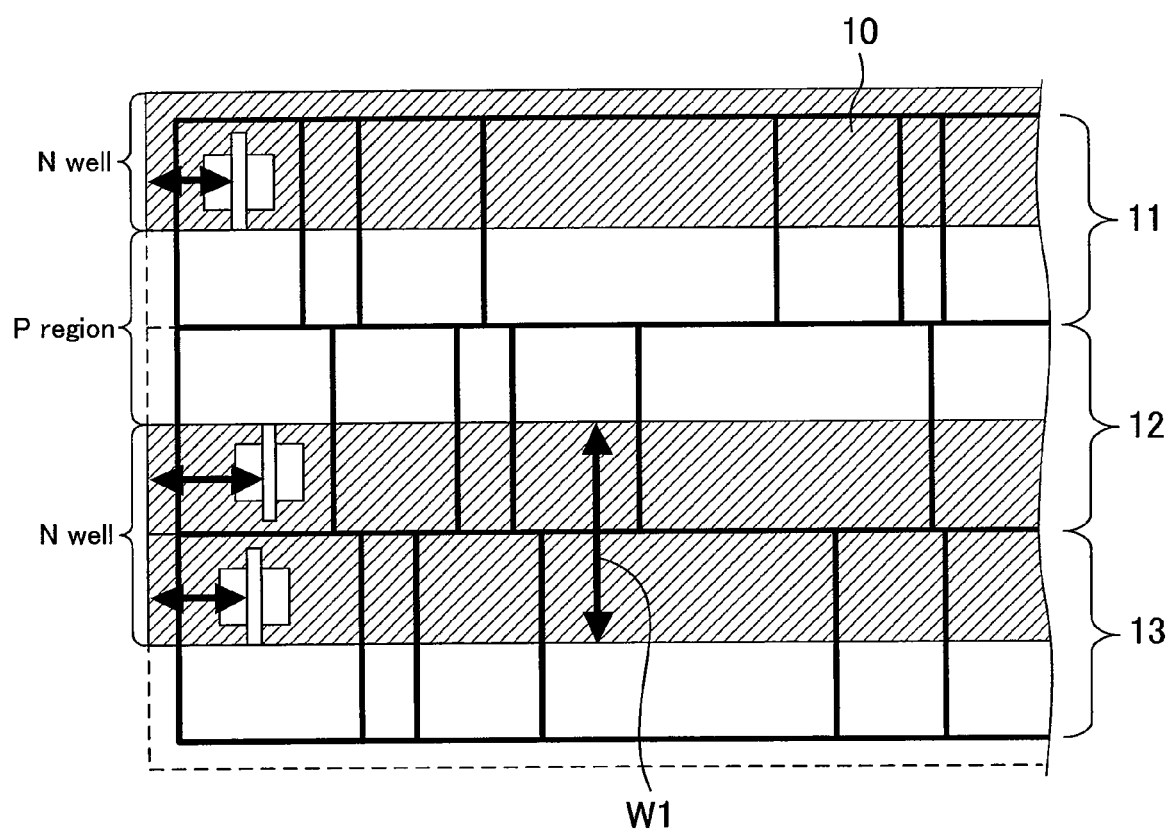
FIG. 26 is a diagram showing an exemplary layout of a conventional semiconductor integrated circuit device.

FIG. 26 shows a layout of a conventional semiconductor integrated circuit device in comparison with FIG. 1.

In the semiconductor integrated circuit device of FIG. 1, the distances D1, D2 and D3 from the PMOS transistors 21, 22 and 23 to the respective N-well ends are broadened, as compared to the conventional layout of FIG. 26. The distances D1, D2 and D3 are also greater than or equal to the width W1 in the vertical direction of the N well shared by the second and third standard cell rows 12 and 13.

Thereby, the well proximity effect can be suppressed at the ends of the standard cell rows 11, 12 and 13, so that the amount of impurities which are reflected and scattered from a resist and are then implanted into a channel region of a transistor can be sufficiently reduced in the PMOS transistors 21, 22 and 23. Therefore, in the standard cell rows 11, 12 and 13, a difference in characteristics between the endmost PMOS transistors 21, 22 and 23 and the PMOS transistors located elsewhere can be eliminated. Therefore, a difference in circuit operation between the design stage and the actual use can be eliminated.

Although the distance from the PMOS transistor located at the left end of each standard cell row to the left end of the N well is broadened in FIG. 1, the distance from the PMOS transistor located at the right end to the right end of the N well may be broadened, or the distances from the PMOS transistors located at both the left and right ends to the left and right ends of the N wells may be broadened.

Although the distance from the PMOS transistor located at the end to the end of the N well is broadened in all of the standard cell rows in FIG. 1, the distance may be broadened in at least one of the standard cell rows, which is included in the present invention.

Figure 2:
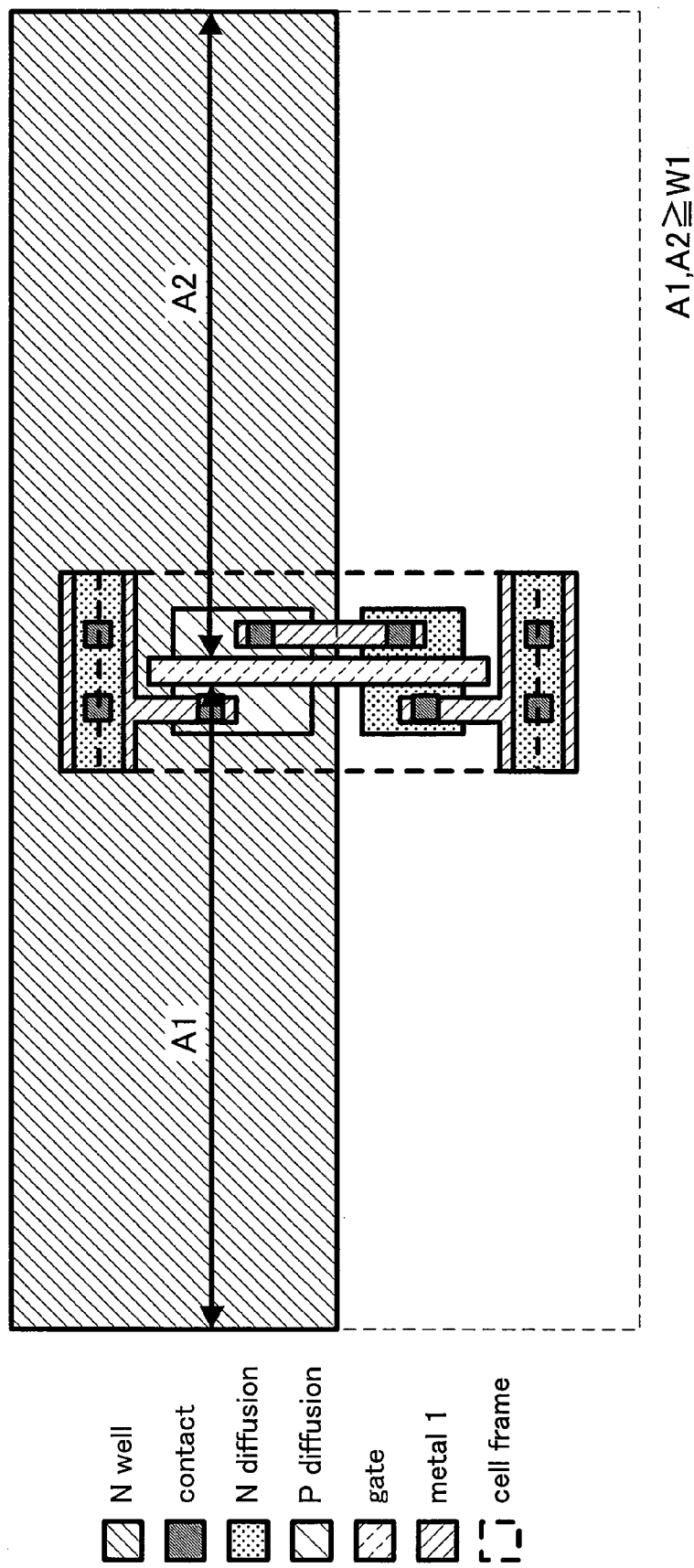
FIG. 2 is a diagram showing an exemplary standard cell for achieving the layout of FIG. 1.
Figure 27:
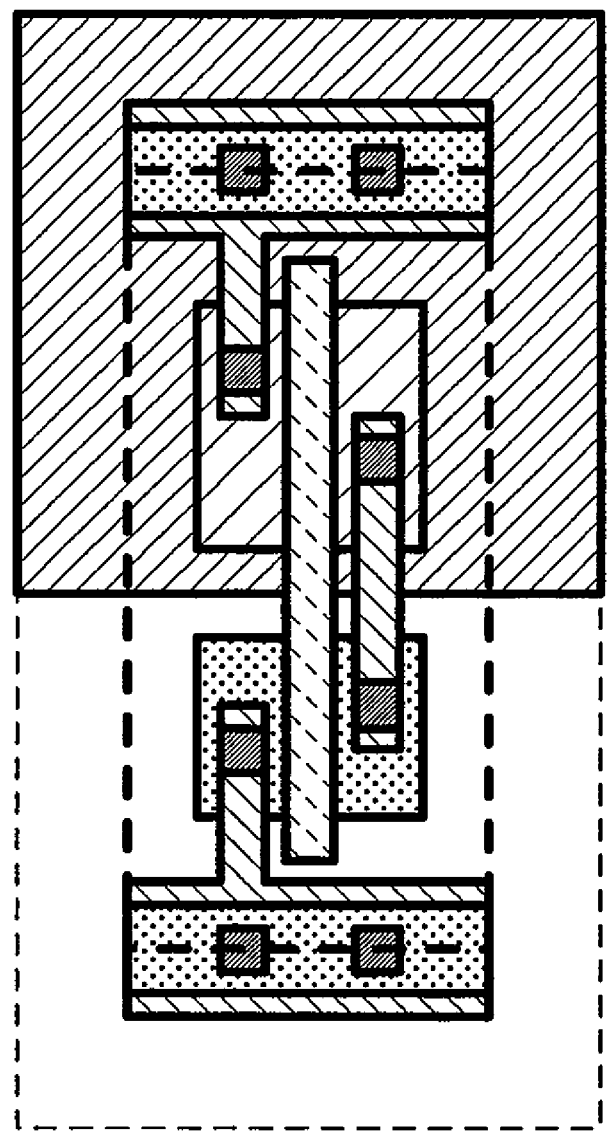
FIG. 27 is a diagram showing an exemplary layout of a conventional standard cell.

FIG. 2 is a diagram showing an exemplary layout pattern of a standard cell for achieving the layout of FIG. 1. The standard cell of FIG. 2 has a broader width in the horizontal direction than that of the conventional standard cell of FIG. 27. In FIG. 2, A1 and A2 each indicate a distance in the horizontal direction from a PMOS transistor to an end of an N well. The layout is formed to satisfy:

A1, A2 ≧ W1.

By arranging standard cells having a broad layout as shown in FIG. 2 to form each standard cell row, a layout in which the distance from the endmost PMOS transistor to the end of the N well is broad can be easily achieved as shown in FIG. 1. Note that, in adjacent standard cells, regions of N wells in which a transistor is not formed overlap each other.

Figure 3:
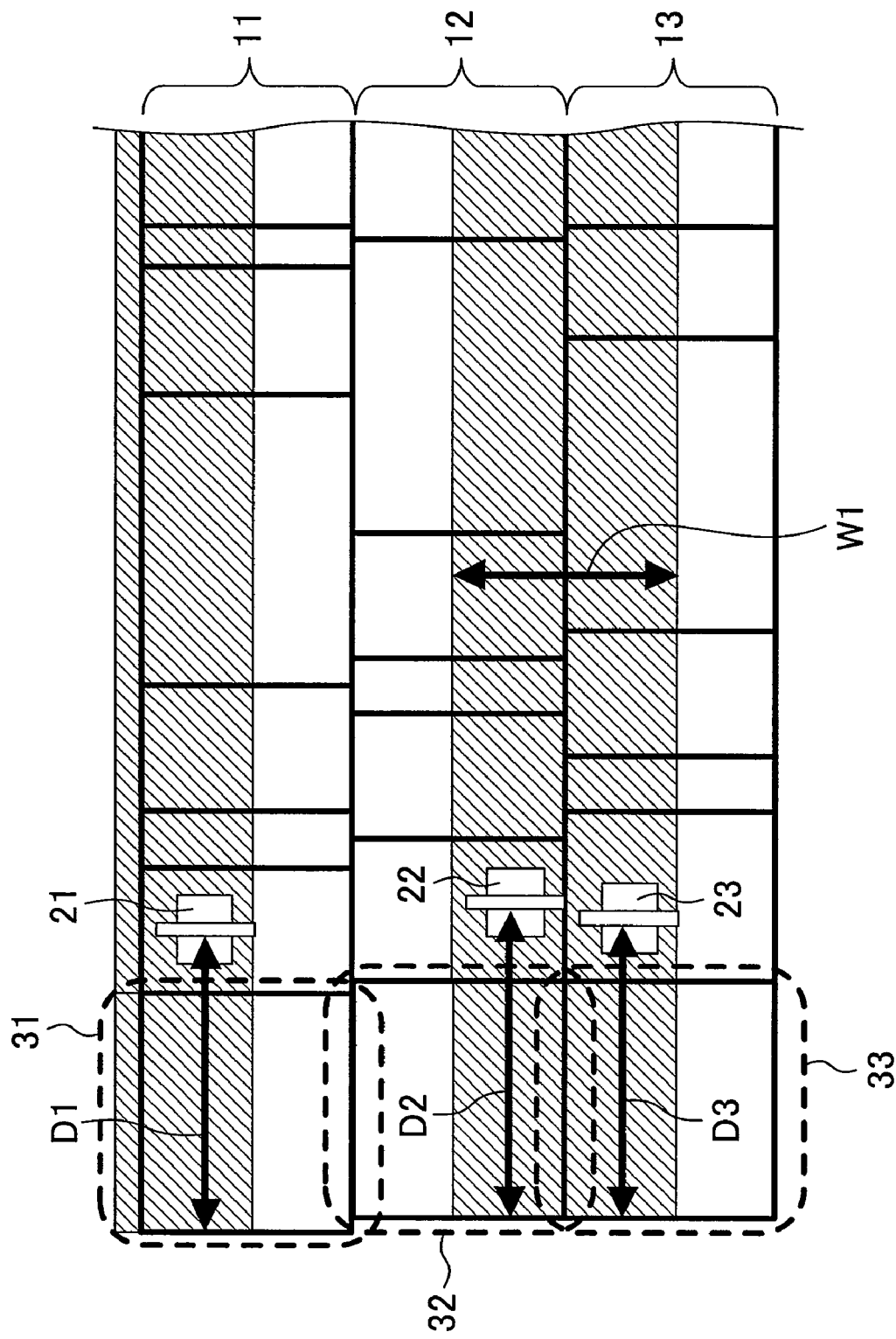
FIG. 3 is a diagram showing the layout of FIG. 1 achieved by arranging a dummy cell.

Also, as shown in FIG. 3, dummy cells 31, 32 and 33 each having an N well may be provided closer to the outside than the standard cells having the PMOS transistors 21, 22 and 23, respectively, thereby making it possible to achieve a layout as shown in FIG. 1. The widths in the horizontal direction of the N wells in the dummy cells 31, 32 and 33 are set to be sufficiently broad so that the distances D1, D2 and D3 are greater than or equal to the width W1.

Although one dummy cell is provided for each standard cell row in FIG. 3, a plurality of dummy cells may be linked and provided together. In other words, the number of dummy cells is not limited as long as the distances D1, D2 and D3 are greater than or equal to the width W1.

Figure 4:
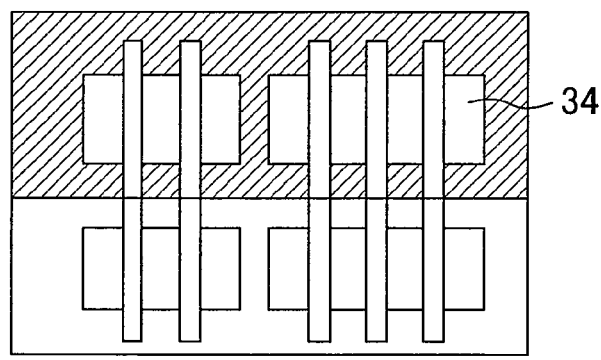
FIG. 4 is a diagram showing another exemplary configuration of a dummy cell.

FIGS. 4 to 8 show other exemplary configurations of a dummy cell. The dummy cell of FIG. 4 is a standard cell which does not share an input/output with any other standard cells. 34 indicates a PMOS transistor. The dummy cell of FIG. 4 can be used as a spare circuit when a malfunction occurs in the circuit or when the circuit needs to be improved. Therefore, the efficiency of the development can be improved.

Figure 5:
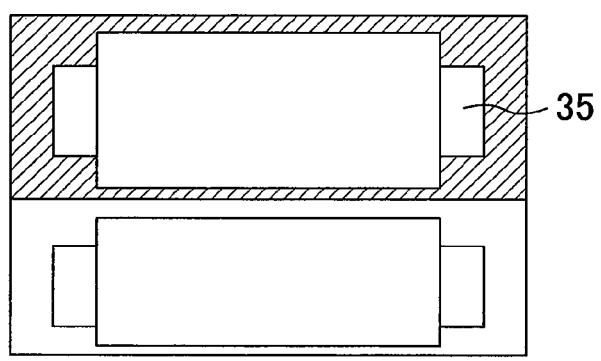
FIG. 5 is a diagram showing another exemplary configuration of a dummy cell.

The dummy cell of FIG. 5 includes an inter-powerline capacitance element 35. By providing the dummy cell of FIG. 5, the power supply capacitance can be increased, so that the power supply noise resistance of a circuit operation can be improved.

Figure 6:
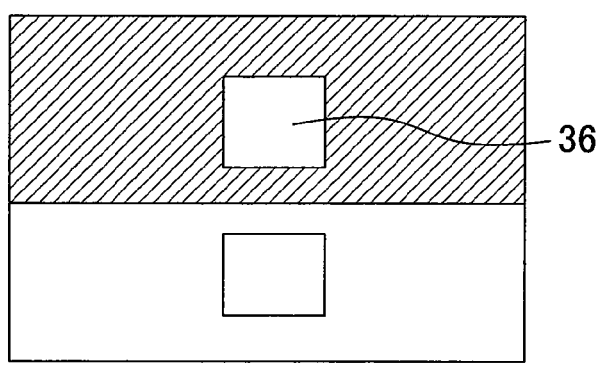
FIG. 6 is a diagram showing another exemplary configuration of a dummy cell.

The dummy cell of FIG. 6 includes a diode element 36. By providing the dummy cell of FIG. 6, it is possible to take measures against the destruction of a gate oxide film due to the accumulation of charges in a microfabrication step, i.e., a so-called antenna effect.

Figure 7:
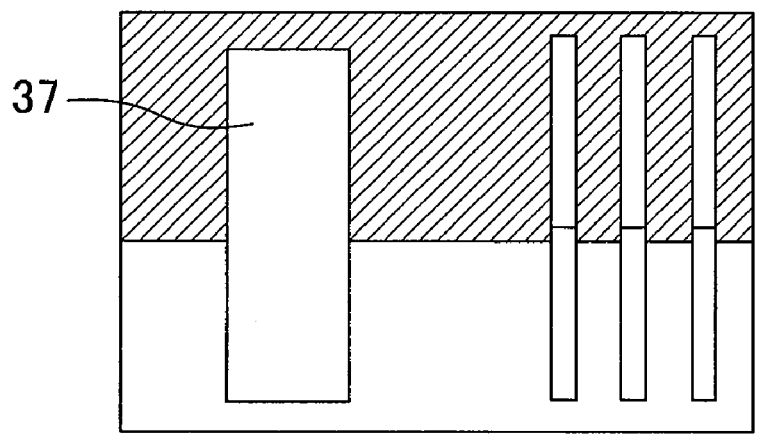
FIG. 7 is a diagram showing another exemplary configuration of a dummy cell.

The dummy cell of FIG. 7 includes a dummy gate 37 which is not connected to any other elements. By providing the dummy cell of FIG. 7, the uniformity of formation of a transistor gate wire at an endmost portion of a standard cell row can be improved, and evenness achieved by a gate wiring process can be improved.

Figure 8:
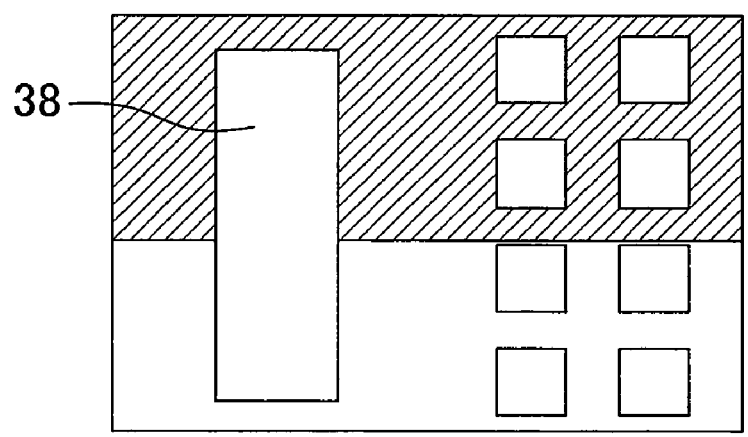
FIG. 8 is a diagram showing another exemplary configuration of a dummy cell.

The dummy cell of FIG. 8 includes a dummy wire 38 which is not connected to any other elements. By providing the dummy cell of FIG. 8, the area ratio of a wiring pattern can be adjusted, so that evenness achieved by a wiring process can be improved.

Second Embodiment

Figure 9:
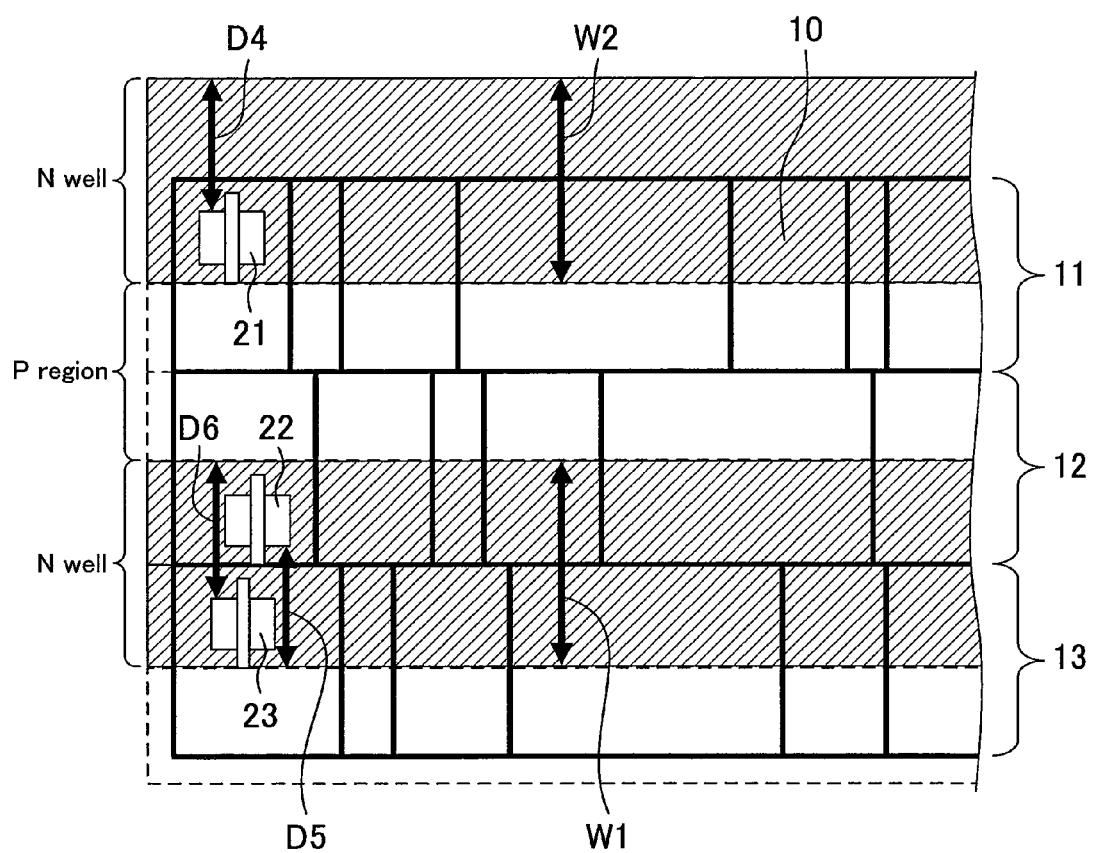
FIG. 9 is a diagram showing a portion of a layout of a semiconductor integrated circuit device according to a second embodiment of the present invention.

FIG. 9 is a diagram showing a portion of a layout of a semiconductor integrated circuit device according to a second embodiment of the present invention. The semiconductor integrated circuit device of FIG. 9 has substantially the same configuration as that of FIG. 1. The same parts are indicated by the same symbols. W2 indicates a width in the vertical direction of an N well in a first standard cell row 11.

In the semiconductor integrated circuit device of FIG. 9, the width W2 in the vertical direction of the N well in the first standard cell row 11 is broadened as compared to the conventional layout of FIG. 26. The width W2 is also greater than or equal to a width (shared-N well width) W1 in the vertical direction of an N well shared by second and third standard cell rows 12 and 13. Thereby, a distance D4 from a PMOS transistor (e.g., a PMOS transistor 21) to a farther end in the vertical direction of the N well in the first standard cell row 11 is greater than or equal to distances D5 and D6 from PMOS transistors (e.g., PMOS transistors 22 and 23) to respective farther ends in the vertical direction of the N well in the second and third standard cell rows 12 and 13.

With such a configuration, the well proximity effect in the first standard cell row 11 can be suppressed to the same extent to which the well proximity effect in the second and third standard cell rows 12 and 13 is suppressed.

Specifically, when the distance D4 is equal to the distances D5 and D6, the amount of impurities which are reflected and scattered from a resist and are then implanted into a channel region of a transistor is substantially the same between in PMOS transistors of the first standard cell row 11 and in PMOS transistors of the second and third standard cell rows 12 and 13. Therefore, a difference in characteristics is eliminated, and a difference in circuit operation between the design stage and the actual use can be eliminated.

Also, when the distance D4 is greater than the distances D5 and D6, the amount of impurities which are reflected and scattered from a resist and are then implanted into a channel region of a transistor is larger in the PMOS transistors of the first standard cell row 11 than in the PMOS transistors of the second and third standard cell rows 12 and 13. Therefore, a difference occurs in which the PMOS transistor in the first standard cell row 11 has a reduced threshold value. In this case, however, cells provided in the first row may be more frequently used for a circuit for which a high-speed circuit operation is required, thereby making it possible to achieve a high-speed circuit.

It has been assumed above that the width of the N well in the uppermost standard cell row is broadened. Similarly, when the width of the N well in the lowermost standard cell row is broadened, an effect similar to that of this embodiment is obtained.

Figure 10:
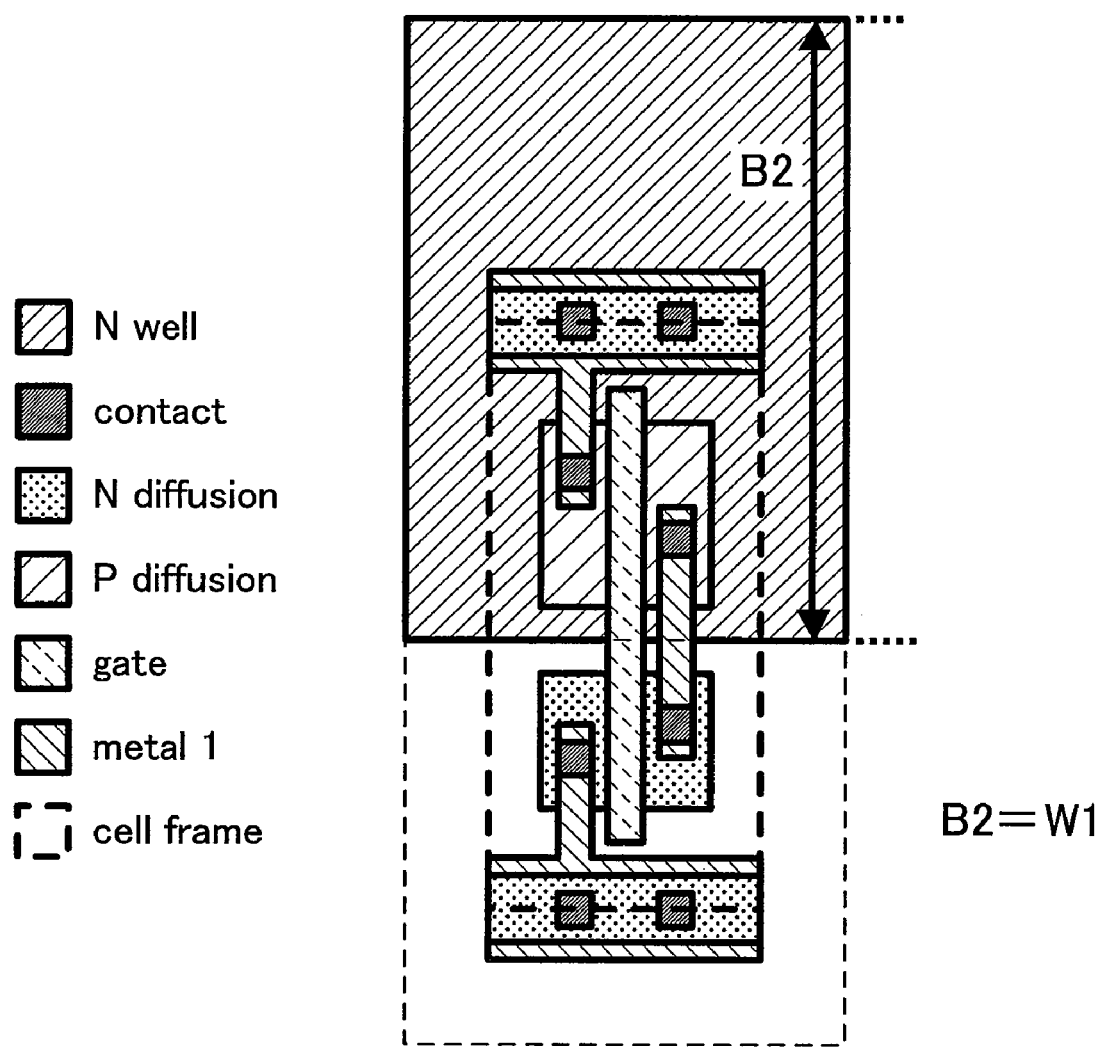
FIG. 10 is a diagram showing an exemplary standard cell for achieving the layout of FIG. 9.

FIG. 10 is a diagram showing an exemplary layout pattern of standard cells for achieving the layout of FIG. 9. In the standard cell of FIG. 10, a width in the vertical direction of the N well is broadened as compared to the conventional standard cell of FIG. 27. In FIG. 10, B2 is the width in the vertical direction of the N well. The layout is formed so as to satisfy:

$$B2=W1.$$

In other words, the width B2 in the vertical direction of the N well is set to be the same as the shared-N well width W1 of FIG. 9.

By arranging the standard cells having a layout in which the N well is vertically broadened as shown in FIG. 10 to form each standard cell row, a layout in which the width in the vertical direction of the N well in the uppermost standard cell row is broadened as shown in FIG. 9 can be easily achieved. Note that it is assumed that, when an N well is shared by upper and lower standard cell rows, N well regions in which a transistor is not formed overlap each other.

Figure 11:
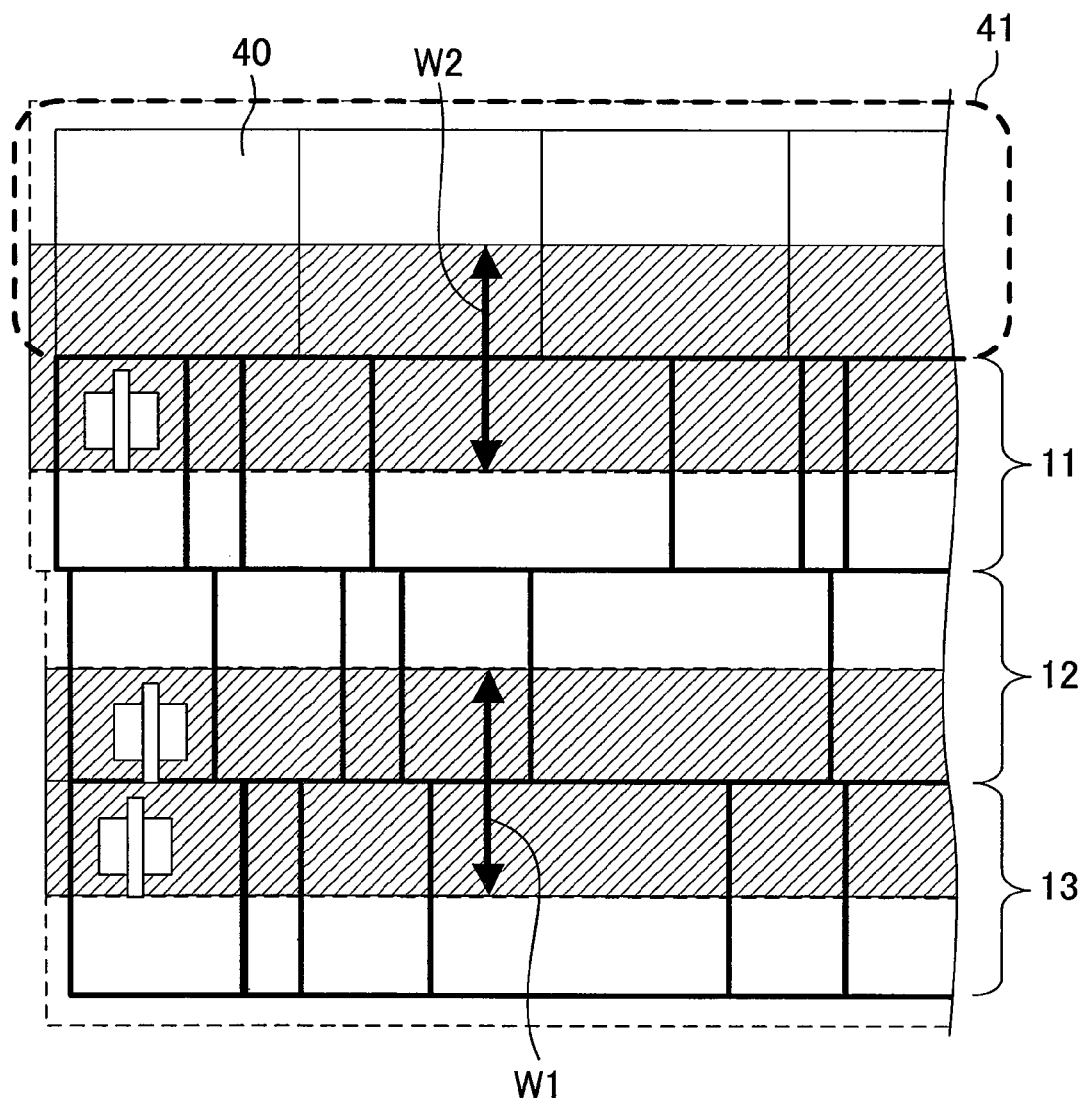
FIG. 11 is a diagram showing the layout of FIG. 9 achieved by arranging a dummy cell.
Figure 12:
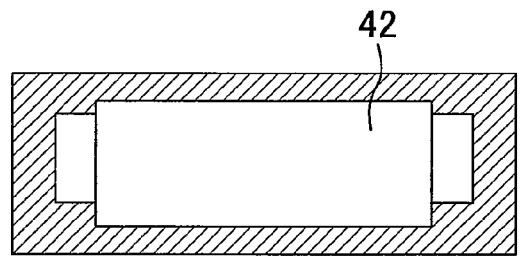
FIG. 12 is a diagram showing another exemplary configuration of a dummy cell having only an N well.

Also, a layout as shown in FIG. 9 can be achieved by arranging a dummy cell row as shown in FIG. 11. In FIG. 11, a dummy cell row 41 in which dummy cells 40 having an N well are arranged in the horizontal direction is arranged above (closer to the outside than) the first standard cell row 11 with the N well being shared with the dummy cell row 41 and the first standard cell row 11.

Instead of the dummy cell 40 of FIG. 11, dummy cells configured as shown in FIGS. 4 to 8 above may be used. In this case, an effect similar to that described above is obtained.

A cell having both an N well and a P region is used as the dummy cell 40 in FIG. 11. Instead of this, a dummy cell having only an N well without a P region may be used. In this case, an increase in layout area due to the addition of a dummy cell row is suppressed.

FIGS. 12 to 15 show other exemplary configurations of a dummy cell having only an N well. The dummy cell of FIG. 12 includes an inter-powerline capacitance element 42. By providing the dummy cell of FIG. 12, the power supply capacitance can be increased, so that the power supply noise resistance of a circuit operation can be improved.

Figure 13:
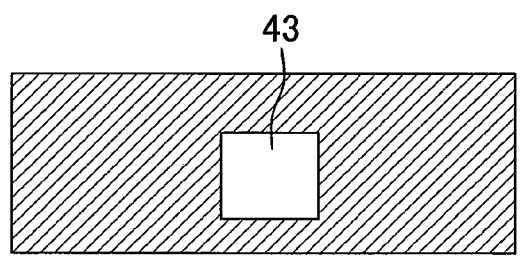
FIG. 13 is a diagram showing another exemplary configuration of a dummy cell having only an N well.

The dummy cell of FIG. 13 includes a diode element 43. By providing the dummy cell of FIG. 13, it is possible to take measures against the destruction of a gate oxide film due to the accumulation of charges in a microfabrication step, i.e., a so-called antenna effect.

Figure 14:
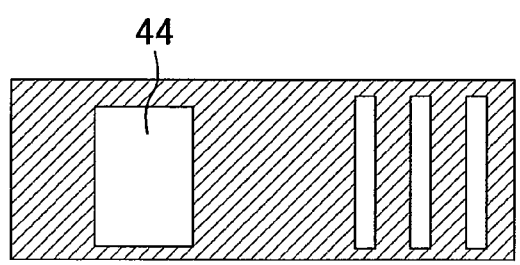
FIG. 14 is a diagram showing another exemplary configuration of a dummy cell having only an N well.

The dummy cell of FIG. 14 includes a dummy gate 44 which is not connected to any other elements. By providing the dummy cell of FIG. 14, the uniformity of formation of a transistor gate wire at an endmost portion of a standard cell row can be improved, and evenness achieved by a gate wiring process can be improved.

Figure 15:
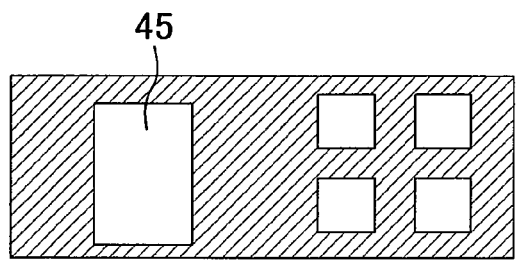
FIG. 15 is a diagram showing another exemplary configuration of a dummy cell having only an N well.

The dummy cell of FIG. 15 includes a dummy wire 45 which is not connected to any other elements. By providing the dummy cell of FIG. 15, the area ratio of a wiring pattern can be adjusted, so that evenness achieved by a wiring process can be improved.

Third Embodiment

Figure 16:
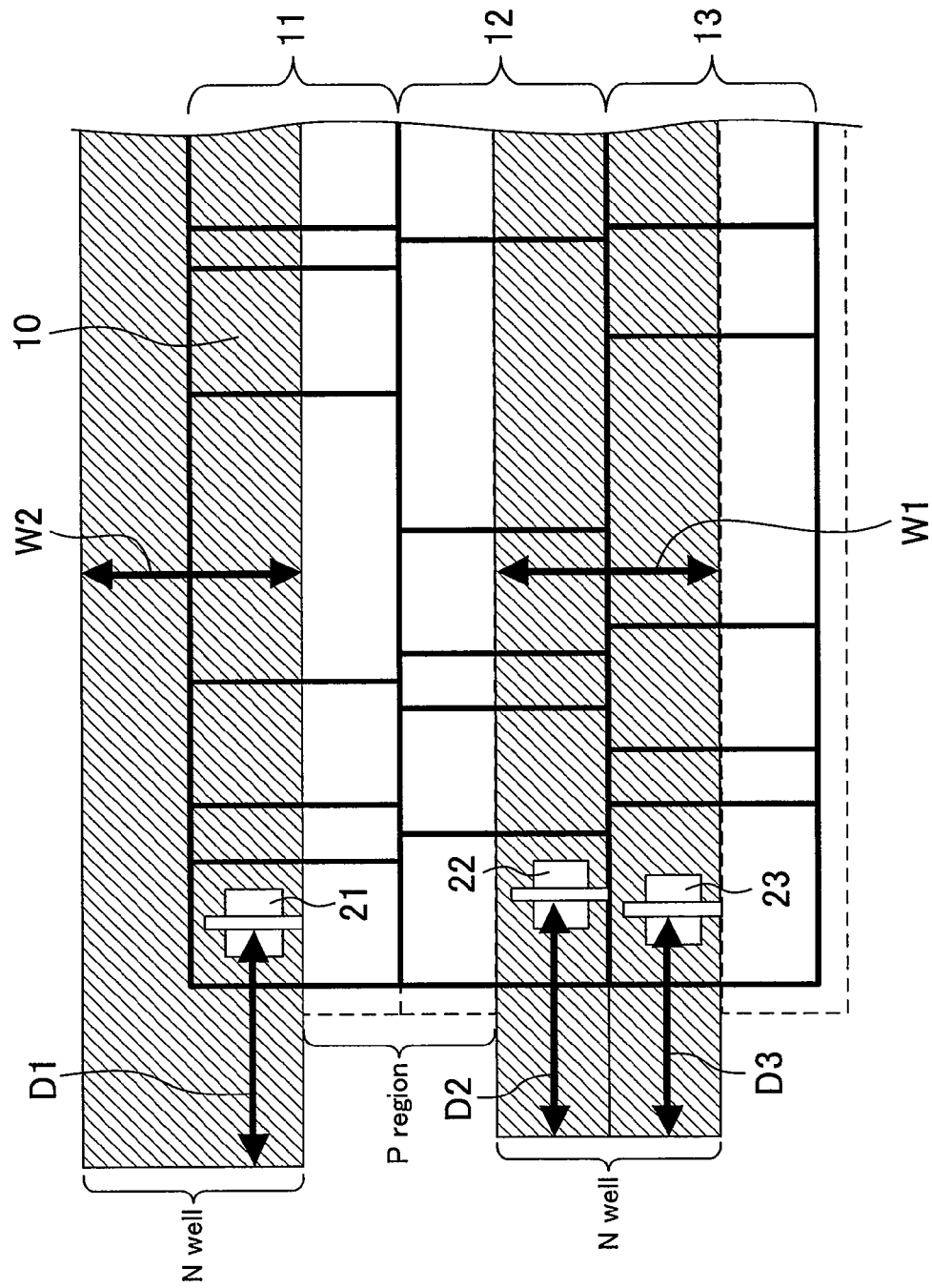
FIG. 16 is a diagram showing a portion of a layout of a semiconductor integrated circuit device according to a third embodiment of the present invention.

A third embodiment of the present invention is a combination of the first and second embodiments. FIG. 16 is a diagram showing a portion of a layout of a semiconductor integrated circuit device according to the third embodiment of the present invention. The semiconductor integrated circuit device of FIG. 16 has substantially the same configuration as that of FIGS. 1 and 9 and the same parts are indicated by the same symbols.

In the semiconductor integrated circuit device of FIG. 16, distances D1, D2 and D3 from PMOS transistors 21, 22 and 23 to ends of N wells are broadened to be greater than or equal to a width W1 in the vertical direction of an N well shared by second and third standard cell rows 12 and 13, as in the semiconductor integrated circuit device of FIG. 1. Also, a width W2 in the vertical direction of an N well in a first standard cell row 11 is broadened to be greater than or equal to the width W1 in the vertical direction of the N well shared by the second and third standard cell rows 12 and 13, as in the semiconductor integrated circuit device of FIG. 9.

According to this embodiment, both the operational effect obtained by the first embodiment and the operational effect obtained by the second embodiment are obtained.

Figure 17:
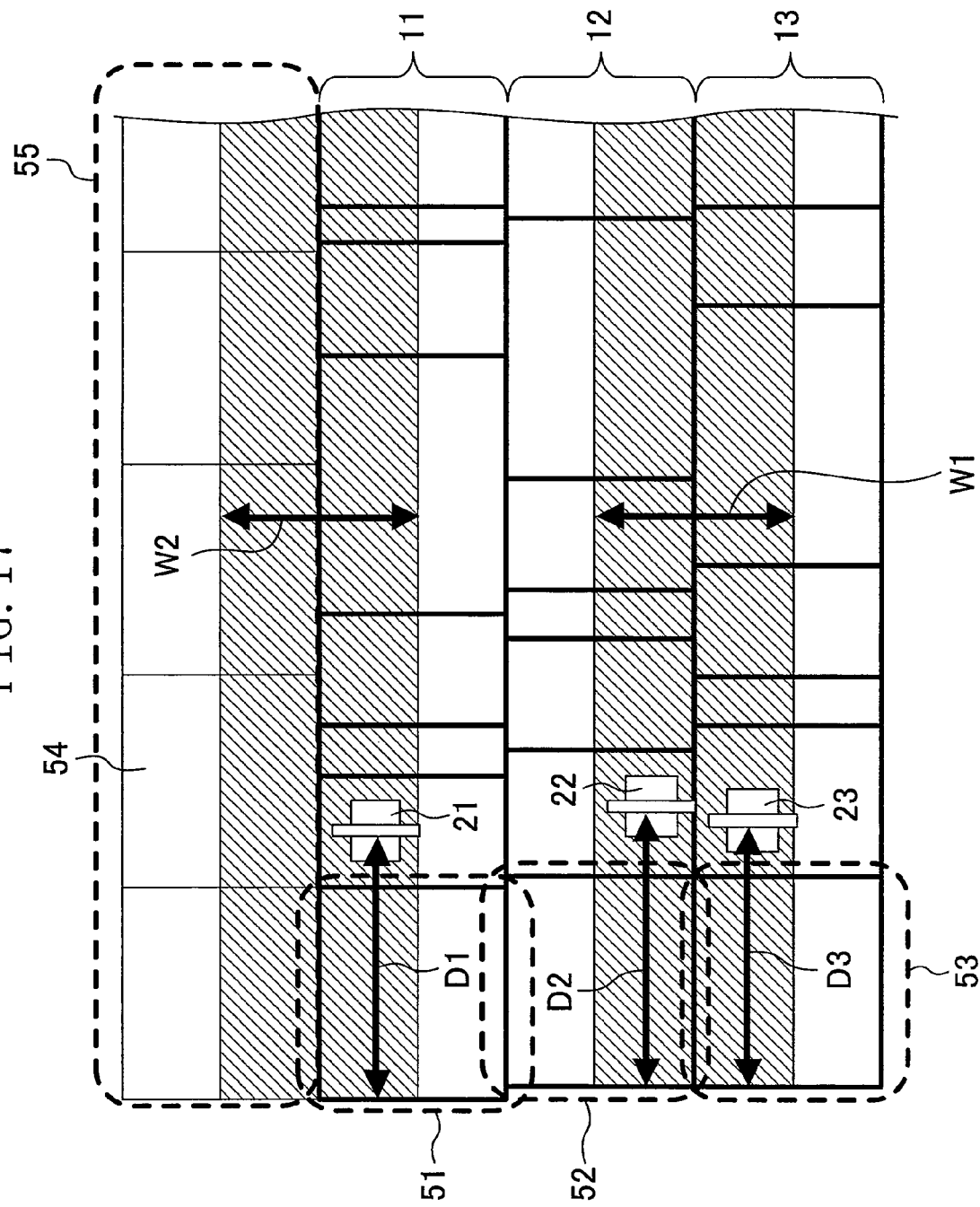
FIG. 17 is a diagram showing an exemplary standard cell for achieving the layout of FIG. 16.

Also, a layout as shown in FIG. 16 can be achieved by arranging dummy cells as shown in FIG. 17. In FIG. 17, dummy cells 51, 52 and 53 having an N well are provided closer to the outside than standard cells having the PMOS transistors 21, 22 and 23. Also, a dummy cell row 55 in which dummy cells 54 having an N well are arranged in the horizontal direction is provided above the first standard cell row 11 with the N well being shared with the dummy cell row 55 and the first standard cell row 11.

Fourth Embodiment

Figure 18:
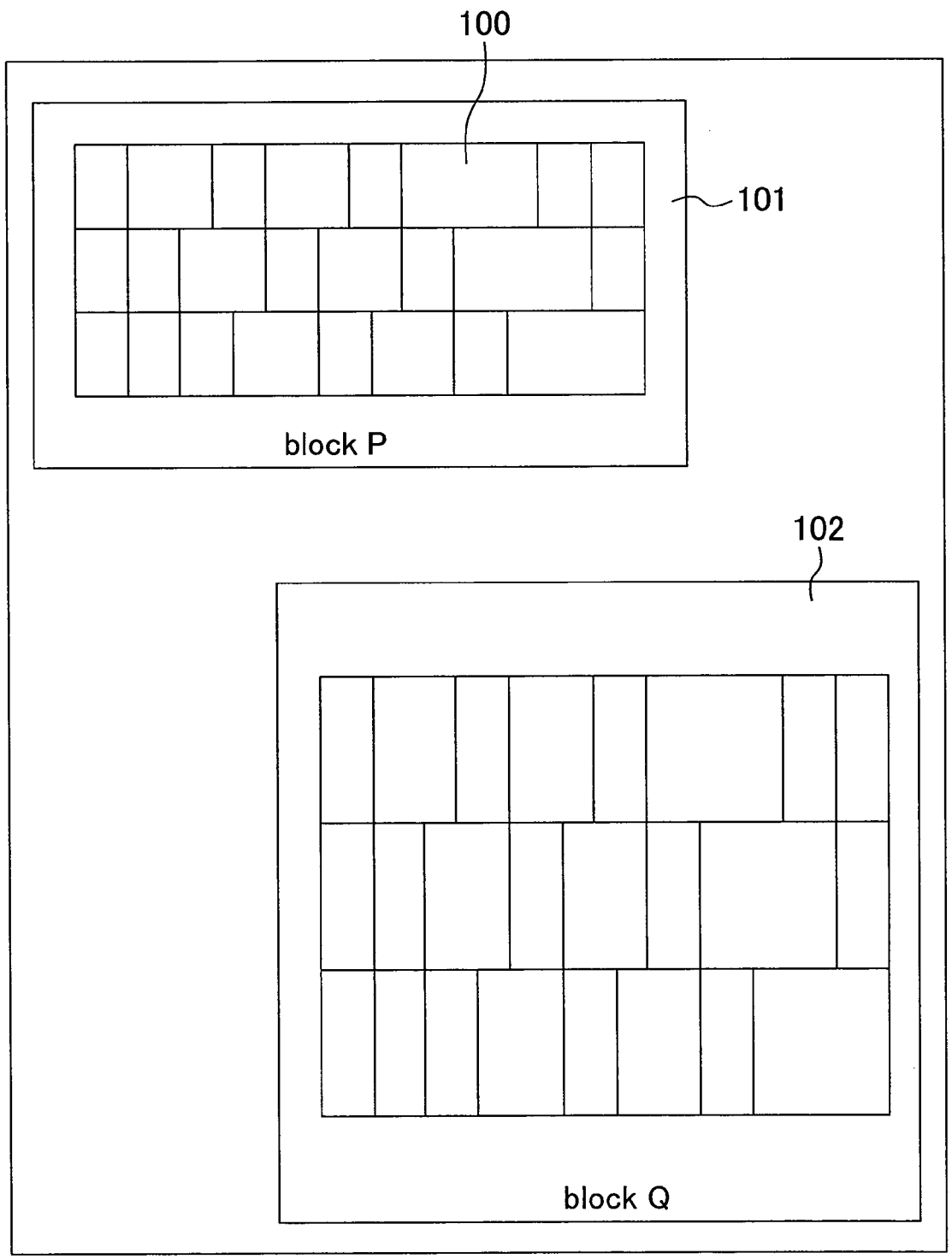
FIG. 18 is a conceptual diagram showing a semiconductor integrated circuit device according to a fourth embodiment of the present invention.

FIG. 18 is a conceptual diagram showing a semiconductor integrated circuit device according to a fourth embodiment of the present invention. The semiconductor integrated circuit device of FIG. 18 includes first and second circuit blocks 101 and 102 (a block P and a block Q) in each of which a plurality of standard cell rows in each of which standard cells 100 are arranged in the horizontal direction are arranged in the vertical direction. Note that a height in the vertical direction of a standard cell is higher in the second circuit block 102 than in the first circuit block 101.

FIGS. 19A and 19B are diagrams showing detailed layouts of the first and second circuit blocks 101 and 102 of FIG. 18, respectively. As shown in FIGS. 19A and 19B, both the first and second circuit blocks 101 and 102 have substantially the same configuration as that of the semiconductor integrated circuit device of FIG. 16.

In FIG. 19A, 61, 62 and 63 indicate standard cell rows in each of which standard cells (shown with rectangles) are arranged in the horizontal direction, and 71, 72 and 73 indicate PMOS transistors which are arranged at left ends of N wells of the standard cell rows 61, 62 and 63. E1 indicates a distance from the PMOS transistor 71 to an end closer thereto in the horizontal direction of the N well, E2 indicates a distance from the PMOS transistor 72 to an end closer thereto in the horizontal direction of the N well, and E3 indicates a distance from the PMOS transistor 73 to an end closer thereto in the horizontal direction of the N well. X1 indicates a width in the vertical direction of the N well shared by the second and third standard cell rows 62 and 63, and X2 indicates a width in the vertical direction of the N well in the first standard cell row 61.

Also, in FIG. 19B, 64, 65 and 66 indicate standard cell rows in each of which standard cells (shown with rectangles) are arranged in the horizontal direction, and 74, 75 and 76 indicate PMOS transistors which are arranged at left ends of N wells of the standard cell rows 64, 65 and 66, respectively. E4 indicates a distance from the PMOS transistor 74 to an end closer thereto in the horizontal direction of the N well, E5 indicates a distance from the PMOS transistor 75 to an end closer thereto in the horizontal direction of the N well, and E6 indicates a distance from the PMOS transistor 76 to an end closer thereto in the horizontal direction of the N well. X3 indicates a width in the vertical direction of the N well shared by the second and third standard cell rows 65 and 66, and X4 indicates a width in the vertical direction of the N well in the first standard cell row 64.

As shown in FIG. 19A, in the first circuit block 101, the width X2 in the vertical direction of the N well in the first standard cell row 61 is greater than or equal to the width X1 in the vertical direction of the N well shared by the second and third standard cell rows 62 and 63. As shown in FIG. 19B, in the second circuit block 102, the width X4 in the vertical direction of the N well in the first standard cell row 64 is greater than or equal to the width X3 in the vertical direction of the N well shared by the second and third standard cell rows 65 and 66.

With such a configuration, an operational effect similar to that of the second embodiment is obtained in the first and second circuit blocks 101 and 102. Specifically, in the first circuit block 101, a difference or a deterioration in characteristics does not occur in the PMOS transistors of the first standard cell row 61, as compared to the PMOS transistors of the second and third standard cell rows 62 and 63. Also, in the second circuit block 102, a difference or a deterioration in characteristics does not occur in the PMOS transistors of the first standard cell row 64, as compared to the PMOS transistors of the second and third standard cell rows 65 and 66.

Also, as shown in FIG. 19A, in the first circuit block 101, the distances E1, E1 and E3 from the PMOS transistors 71, 72 and 73 to the ends of the N wells are broadened. The distances E1, E2 and E3 are broadened to be greater than or equal to the width X1 in the vertical direction of the N well shared by the second and third standard cell rows 62 and 63. Thereby, an operational effect similar to that of the first embodiment is obtained.

Also, as shown in FIG. 19B, in the second circuit block 102, the distances E4, E5 and E6 from the PMOS transistors 74, 75 and 76 to the ends of the N well are broadened. Note that, in this case, the distances E4, E5 and E6 may be greater than or equal to the width X1 in the vertical direction of the N well shared by the second and third standard cell rows 62 and 63 in the first circuit block 101. Thereby, an operational effect similar to that of the first embodiment is obtained.

Specifically, in a semiconductor integrated circuit device having a plurality of circuit blocks having different cell heights, a width in the horizontal direction of an N well may be broadened with reference to a width of a shared N well in a circuit block having a smaller cell height.

Although the distance from the PMOS transistor located at the left end of each standard cell row to the left end of the N well is broadened in FIGS. 19A and 19B, the distance from the PMOS transistor located at the right end to the right end of the N well may be broadened, or the distances from the PMOS transistors located at both the left and right ends to the left and right ends of the N wells may be broadened.

Although the distance from the PMOS transistor located at the end to the end of the N well is broadened in all of the standard cell rows in FIGS. 19A and 19B, the distance may be broadened in at least one of the standard cell row, which is included in the present invention.

Fifth Embodiment

Figure 20:
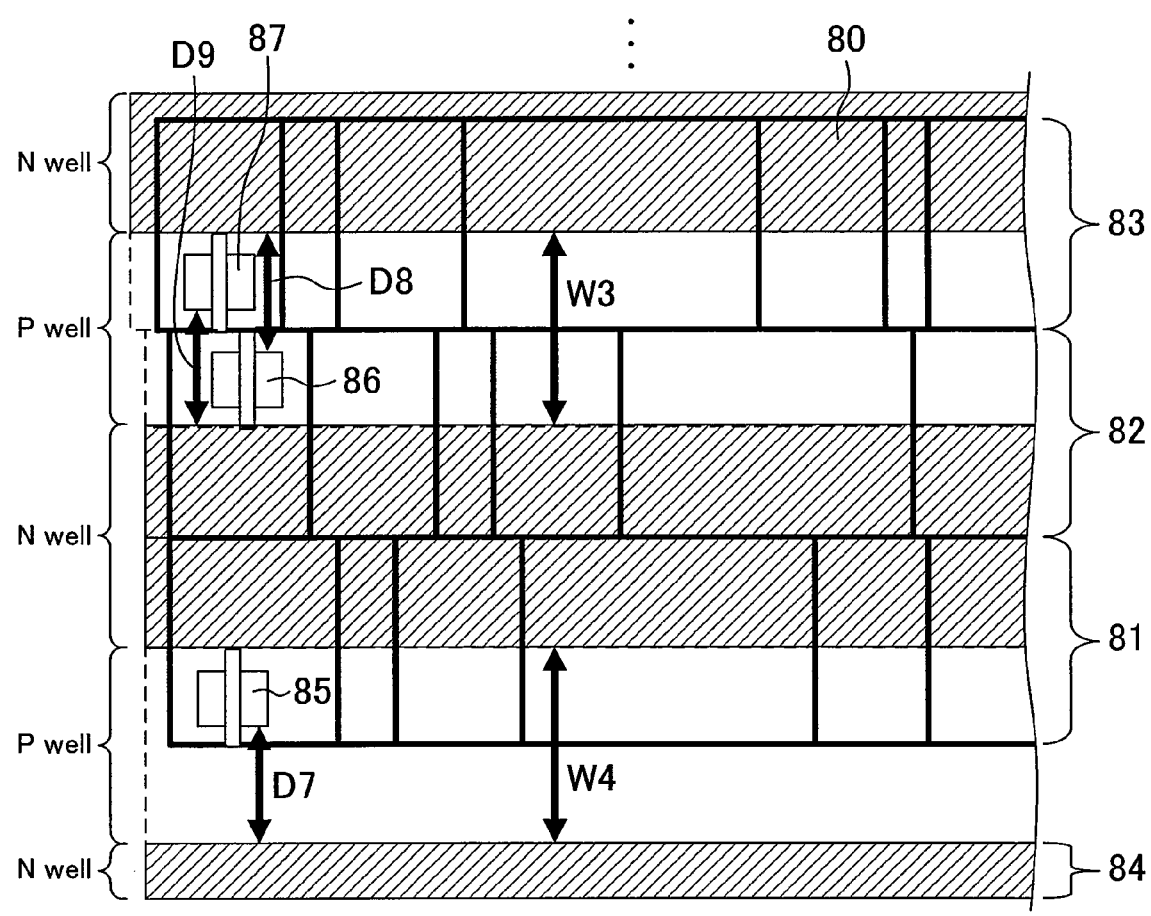
FIG. 20 is a conceptual diagram showing a semiconductor integrated circuit device according to a fifth embodiment of the present invention.

FIG. 20 is a diagram showing a portion of a layout of a semiconductor integrated circuit device according to a fifth embodiment of the present invention. In FIG. 20, 81, 82 and 83 indicate standard cell rows in which standard cells 80 (shown with rectangles) are arranged in the horizontal direction. The standard cell rows 81, 82, 83, . . . are arranged in the vertical direction to form a circuit block. The standard cell row 81 is the lowermost row. Each of the standard cell rows 81, 82 and 83 includes an N well and a P well which extend in the horizontal direction and are adjacent to each other in the vertical direction. Each standard cell 80 has a PMOS transistor formed in the N well and an NMOS transistor formed in the P well. Note that transistors other than the NMOS transistors 85, 86 and 87 are not shown.

The semiconductor integrated circuit device of FIG. 20 has a twin-well structure in which the PMOS transistors are formed on the N well and the NMOS transistors are formed on the P well.

In the standard cell rows 81, 82 and 83, positions in the vertical direction of the N well and the P well are switched every other row. Specifically, the standard cell row 82 is flipped. Also, as viewed from the bottom, the first and second standard cell rows 81 and 82 share the N well, and the second and third standard cell rows 82 and 83 share the P well.

84 indicates an N-well pattern. W3 indicates a width in the vertical direction of the P well shared by the second and third standard cell rows 82 and 83, and W4 indicates a width in the vertical direction of the P well in the first standard cell row 81.

In FIG. 20, the N-well pattern 84 is arranged so that the width W4 in the vertical direction of the P well in the first standard cell row 81 is greater than or equal to the width W3 in the vertical direction of the P well shared by the second and third standard cell rows 82 and 83. Thereby, a distance D7 from an NMOS transistor (e.g., the NMOS transistor 85) to a farther end in the vertical direction of the P well in the first standard cell row 81 is greater than or equal to distances D8 and D9 from NMOS transistors (e.g., the NMOS transistors 86 and 87) to respective farther ends in the vertical direction of the P well in the second and third standard cell rows 82 and 83. Therefore, a difference or a deterioration in characteristics does not occur in the NMOS transistor of the first standard cell row 81, as compared to the NMOS transistors of the second and third standard cell rows 82 and 83.

Figure 21:
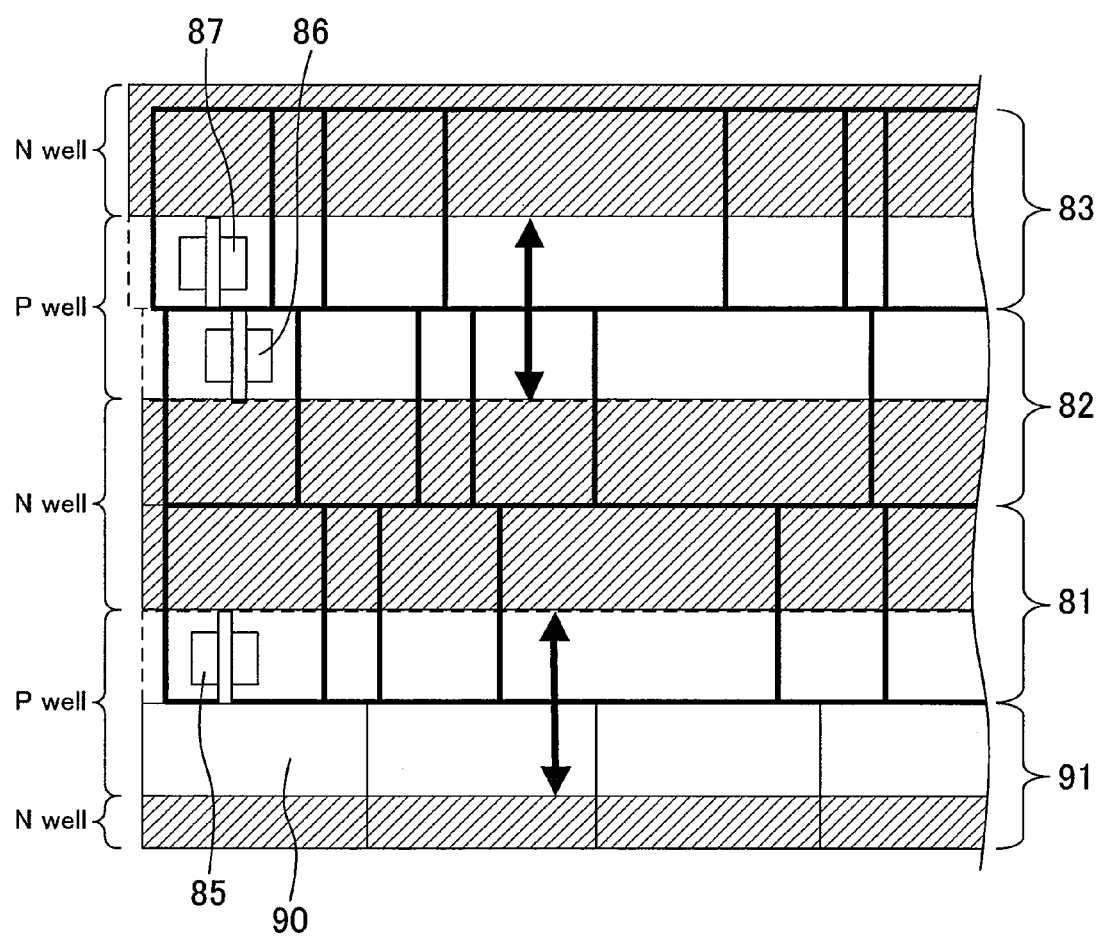
FIG. 21 is a diagram showing the layout of FIG. 20 achieved by arranging a dummy cell.
Figure 22:
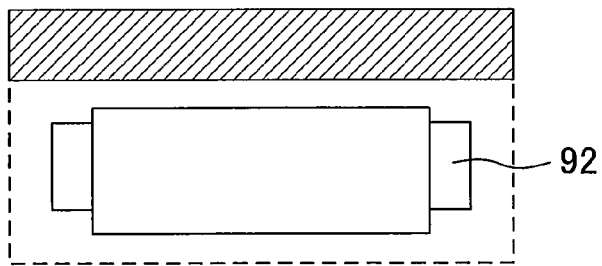
FIG. 22 is a diagram showing another exemplary configuration of a dummy cell.

Also, a layout as shown in FIG. 20 can be achieved by arranging a dummy cell row as shown in FIG. 21. In FIG. 21, a dummy cell row 91 in which dummy cells 90 are arranged in the horizontal direction is arranged below (closer to the outside than) the first standard cell row 81 with the P well being shared with the dummy cell row 91 and the first standard cell row 81. Note that the dummy cell 90 may be comprised of a P well and a minimum number of N well patterns which are required to provide a border between an N well and the P well. Thereby, an increase in layout area due to the dummy cell arrangement can be suppressed.

FIGS. 22 to 25 show other exemplary configurations of a dummy cell. The dummy cell of FIG. 22 includes an inter-powerline capacitance element 92. By providing the dummy cell of FIG. 22, the power supply capacitance can be increased, so that the power supply noise resistance of a circuit operation can be improved.

Figure 23:
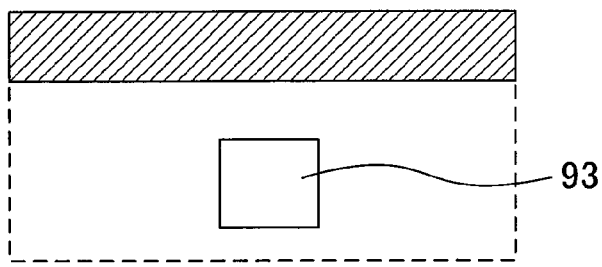
FIG. 23 is a diagram showing another exemplary configuration of a dummy cell.

The dummy cell of FIG. 23 includes a diode element 93. By providing the dummy cell of FIG. 23, it is possible to take measures against the destruction of a gate oxide film due to the accumulation of charges in a microfabrication step, i.e., a so-called antenna effect.

Figure 24:
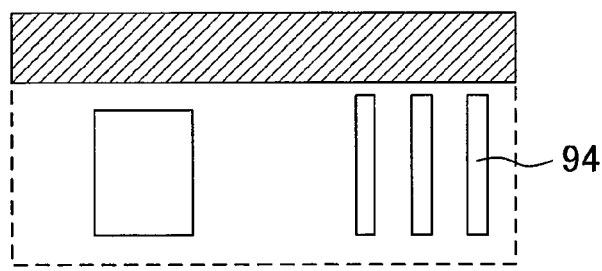
FIG. 24 is a diagram showing another exemplary configuration of a dummy cell.

The dummy cell of FIG. 24 includes a dummy gate 94 which is not connected to any other elements. By providing the dummy cell of FIG. 24, the uniformity of formation of a transistor gate wire at an endmost portion of a standard cell row can be improved, and evenness achieved by a gate wiring process can be improved.

Figure 25:
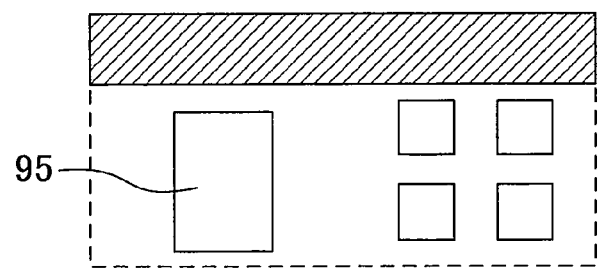
FIG. 25 is a diagram showing another exemplary configuration of a dummy cell.

The dummy cell of FIG. 25 includes a dummy wire 95 which is not connected to any other elements. By providing the dummy cell of FIG. 25, the area ratio of a wiring pattern can be adjusted, so that evenness achieved by a wiring process can be improved.

It has been assumed above that the width of the P well in the lowermost standard cell row is broadened. Similarly, when the width of the P well in the uppermost standard cell row is similarly broadened, an effect similar to that of this embodiment is obtained.

Sixth Embodiment

Figure 28:
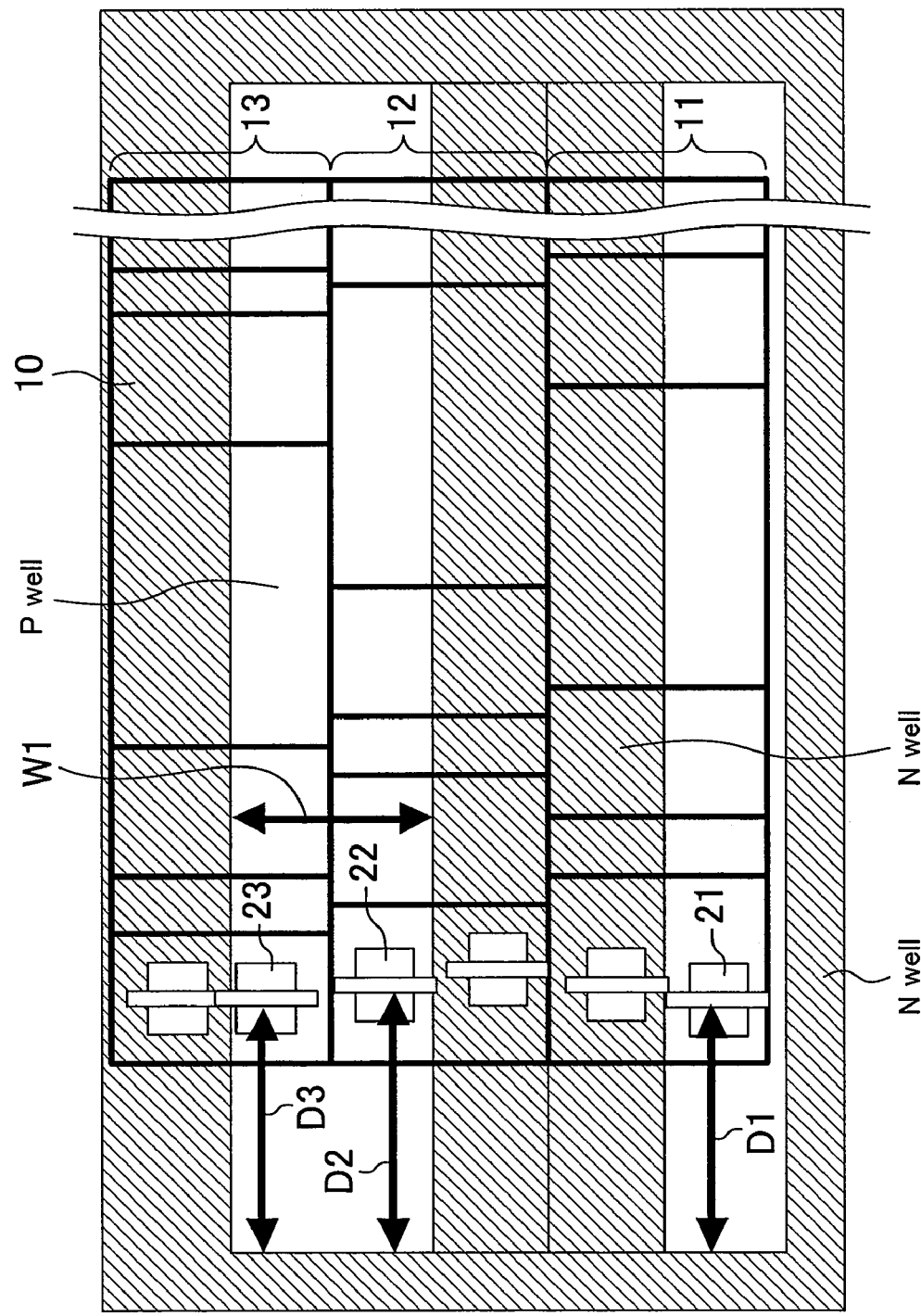
FIG. 28 is a diagram showing a portion of a layout of a semiconductor integrated circuit device according to a sixth embodiment of the present invention.

FIG. 28 is a diagram showing a portion of a layout of a semiconductor integrated circuit device according to a sixth embodiment of the present invention. In FIG. 28, 11, 12 and 13 indicate standard cell rows in each of which standard cells 10 (shown with rectangles) are arranged in the horizontal direction. The standard cell rows 11, 12, 13, . . . are arranged in the vertical direction to form a circuit block. The standard cell row 11 is the lowermost row. Each of the standard cell rows 11, 12 and 13 includes an N well and a P well which extend in the horizontal direction and are arranged adjacent to each other in the vertical direction. Each standard cell 10 has a PMOS transistor formed in the N well and an NMOS transistor formed in the P well. Note that transistors other than the NMOS transistors 21, 22 and 23 and some PMOS transistors are not shown.

The semiconductor integrated circuit device of FIG. 28 has a triple-well structure in which PMOS transistors are formed on an N well and NMOS transistors are formed on a P well, and the N well and the P well are formed on a deep N well (triple well).

In the standard cell rows 11, 12 and 13, positions in the vertical direction of the N well and the P well are switched every other row. Specifically, the standard cell row 12 is flipped. Also, as viewed from the bottom, the first and second standard cell rows 11 and 12 share the N well, and the second and third standard cell rows 12 and 13 share the P well.

Also, in FIG. 28, the NMOS transistors 21, 22 and 23 are located at left ends of the P wells of the standard cell rows 11, 12 and 13, respectively. D1 indicates a distance from the NMOS transistor 21 to an end closer thereto in the horizontal direction of the P well, D2 indicates a distance from the NMOS transistor 22 to an end closer thereto in the horizontal direction of the P well, and D3 indicates a distance from the NMOS transistor 23 to an end closer thereto in the horizontal direction of the P well. W1 indicates a width (shared-P well width) in the vertical direction of the P well shared by the second and third standard cell rows 12 and 13.

Figure 49:
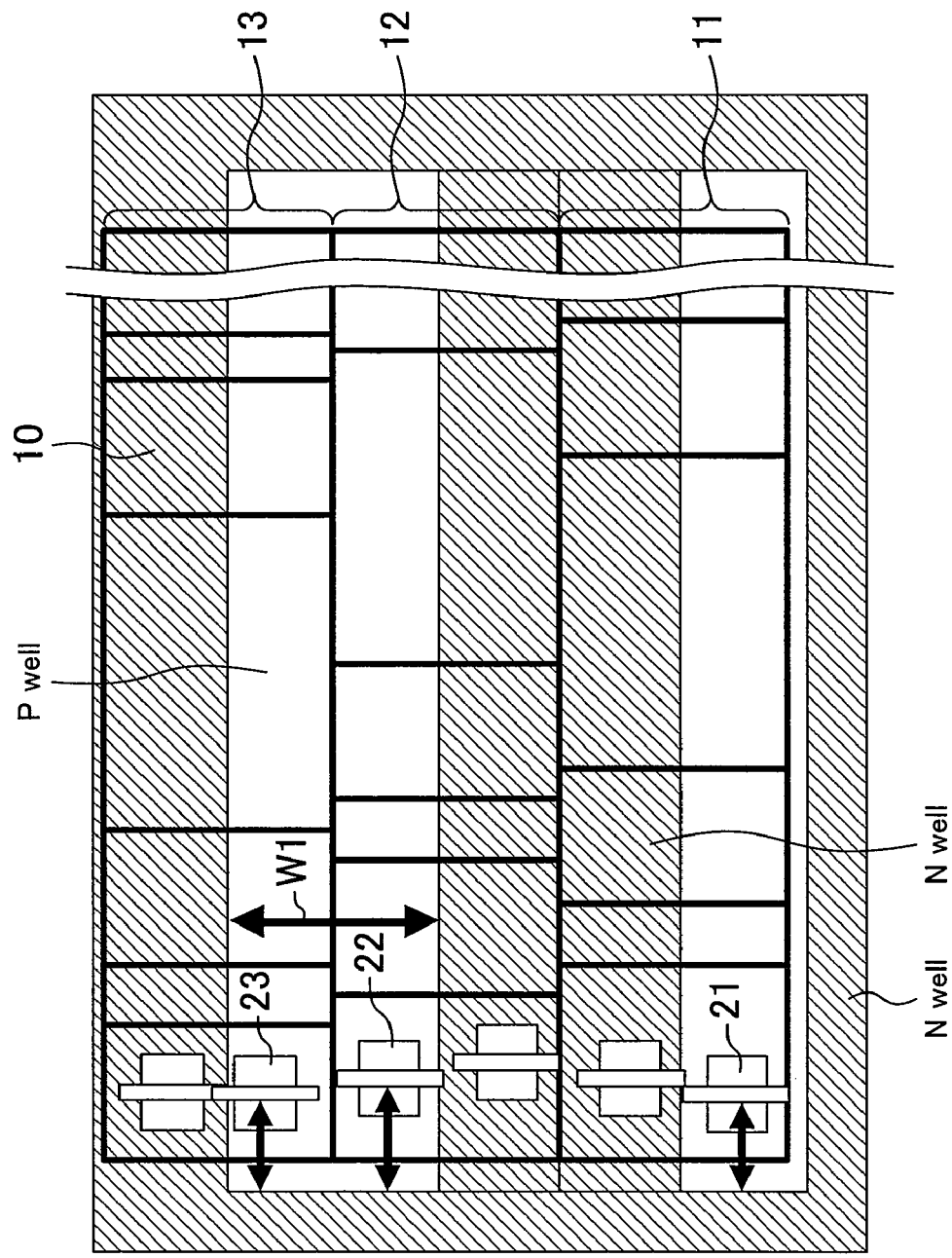
FIG. 49 is a diagram showing an exemplary layout of a conventional semiconductor integrated circuit device.

FIG. 49 shows a layout of a conventional semiconductor integrated circuit device in comparison with FIG. 28.

In the semiconductor integrated circuit device of FIG. 28, the distances D1, D2 and D3 from the NMOS transistors 21, 22 and 23 to the respective P-well ends are broadened as compared to the conventional layout of FIG. 49. The distances D1, D2 and D3 are also greater than or equal to the width W1 in the vertical direction of the P well shared by the second and third standard cell rows 12 and 13.

Thereby, the well proximity effect can be suppressed at the ends of the standard cell rows 11, 12 and 13, so that the amount of impurities which are reflected and scattered from a resist and are then implanted into a channel region of a transistor can be sufficiently reduced in the NMOS transistors 21, 22 and 23. Therefore, in the standard cell rows 11, 12 and 13, a difference in characteristics between the endmost NMOS transistors 21, 22 and 23 and the NMOS transistors located elsewhere can be eliminated. Therefore, a difference in circuit operation between the design stage and the actual use can be eliminated.

Although the distance from the NMOS transistor located at the left end of each standard cell row to the left end of the P well is broadened in FIG. 28, the distance from an NMOS transistor located at the right end to the right end of the P well may be broadened, or the distances from the NMOS transistors located at both the left and right ends to the left and right ends of the P wells may be broadened.

Although the distance from the NMOS transistor located at the end to the end of the P well is broadened in all of the standard cell rows in FIG. 28, the distance may be broadened in at least one of the standard cell rows, which is included in the present invention.

Figure 29:
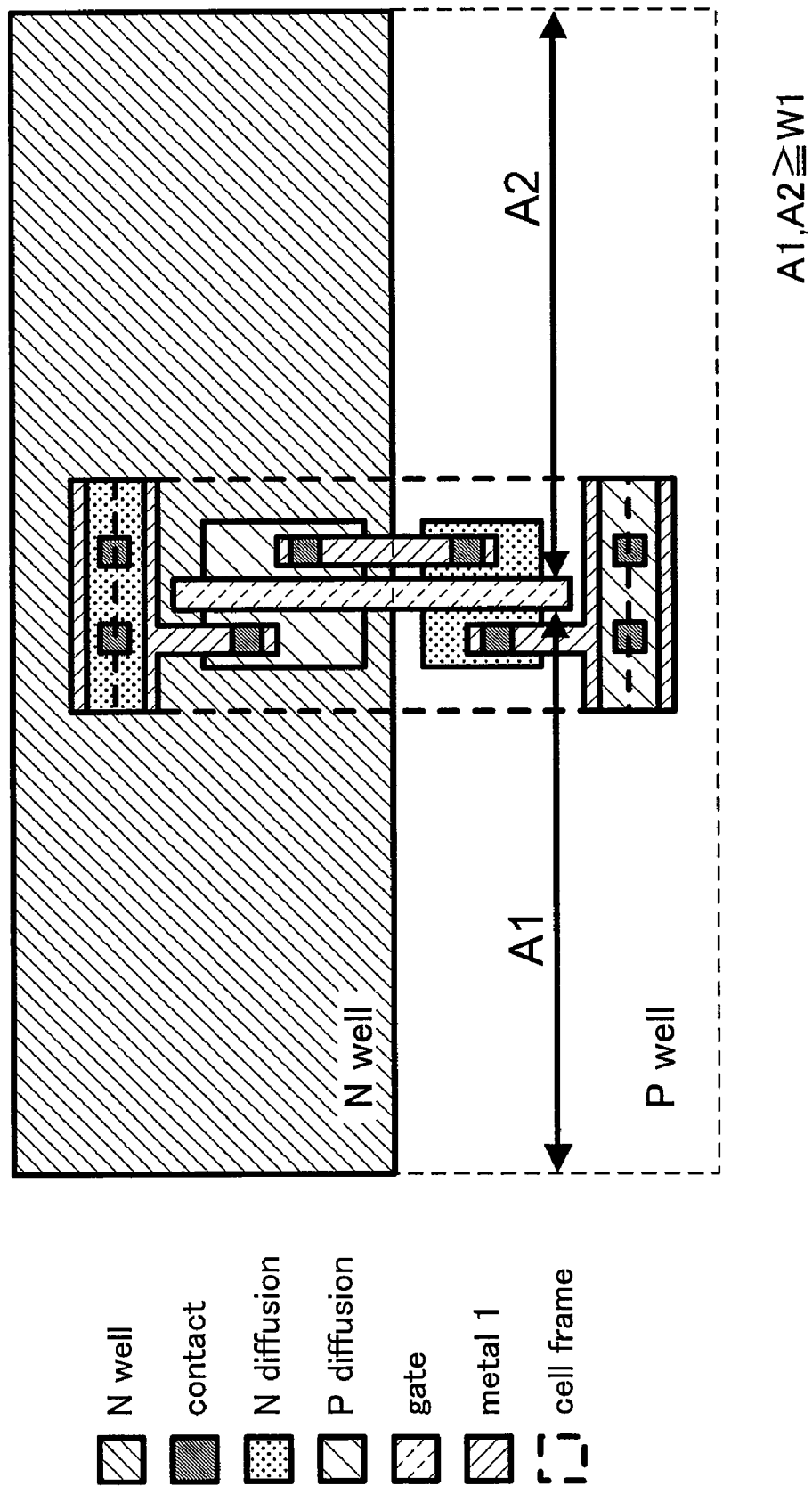
FIG. 29 is a diagram showing an exemplary standard cell for achieving the layout of FIG. 28.
Figure 50:
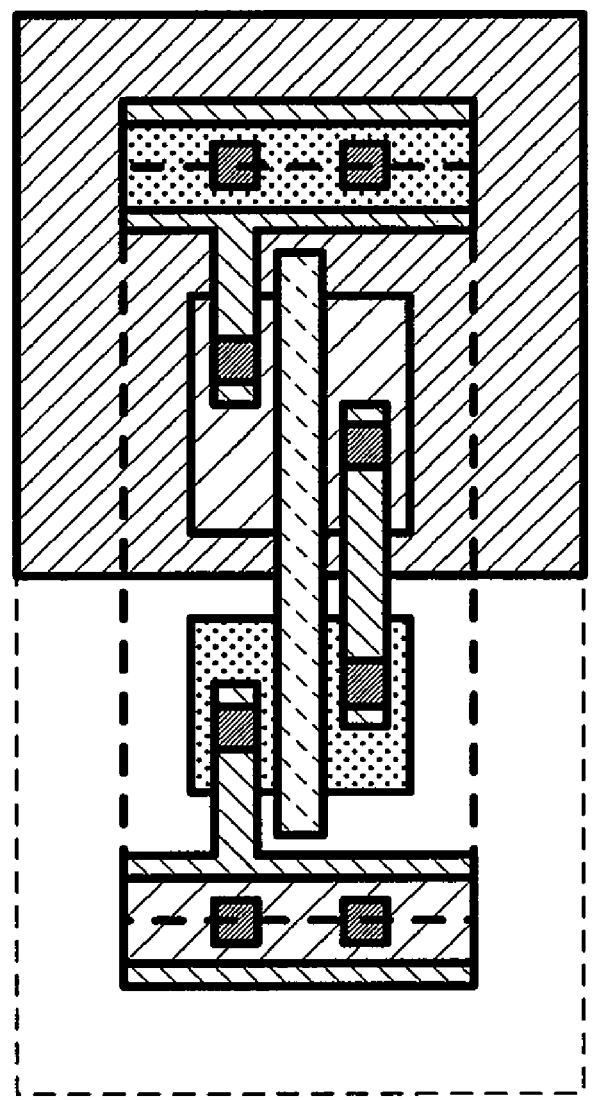
FIG. 50 is a diagram showing an exemplary layout of a conventional standard cell.

FIG. 29 is a diagram showing an exemplary layout pattern of standard cells for achieving the layout of FIG. 28. The standard cell of FIG. 29 has a broader width in the horizontal direction than that of a conventional standard cell of FIG. 50. In FIG. 29, A1 and A2 each indicate a distance from an NMOS transistor to an end in the horizontal direction of a P well. The layout is formed to satisfy:

A1, A2≧W1.

By arranging standard cells having a broad layout as shown in FIG. 29 to form each standard cell row, a layout in which the distance from the endmost NMOS transistor to the end of the P well is broadened can be achieved as shown in FIG. 28. Note that, in adjacent standard cells, regions of the N well and the P well in which a transistor is not formed overlap each other.

Figure 30:
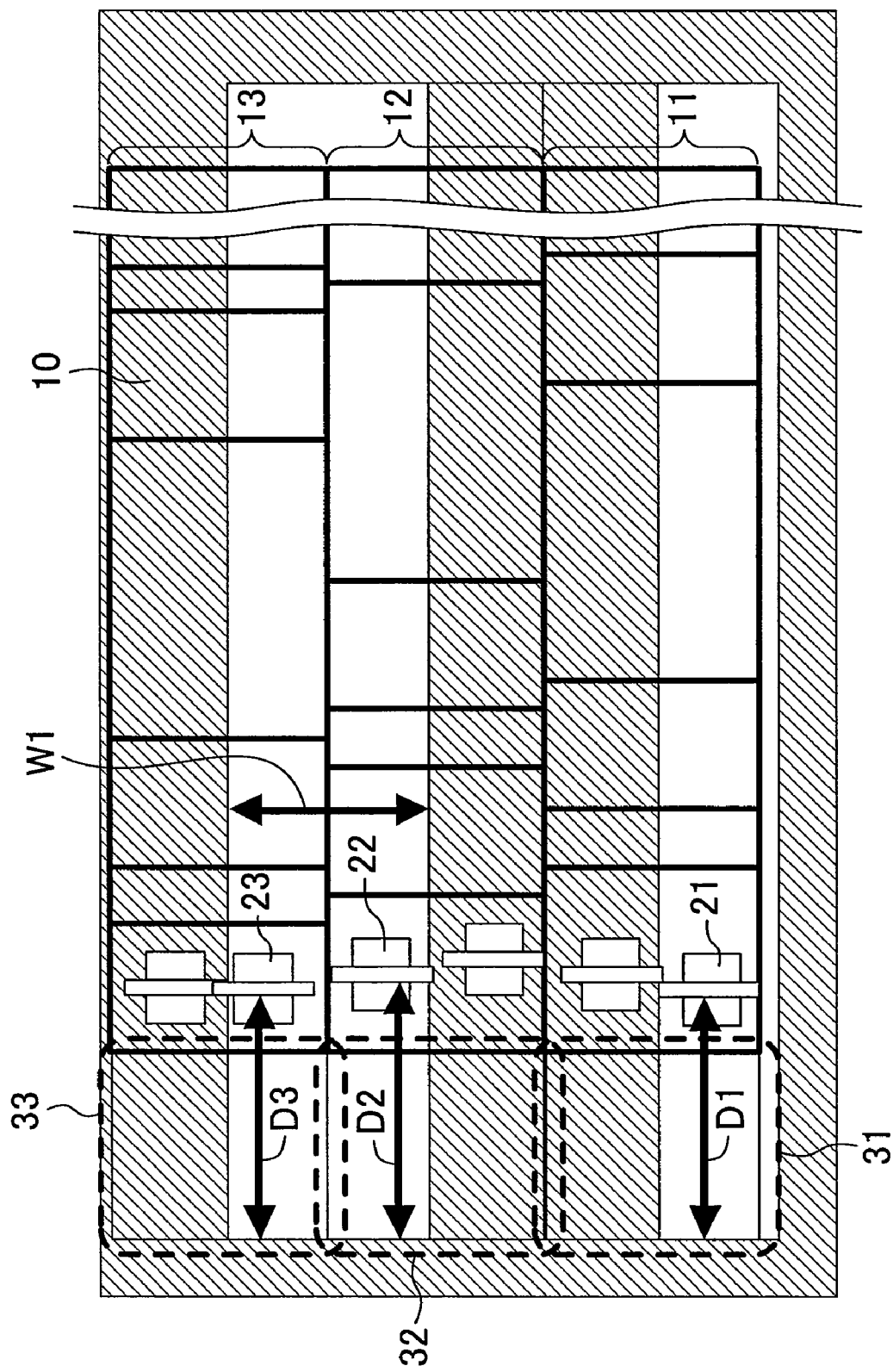
FIG. 30 is a diagram showing the layout of FIG. 28 achieved by arranging a dummy cell.

Also, as shown in FIG. 30, dummy cells 31, 32 and 33 each having a P well may be provided closer to the outside than the standard cells having the NMOS transistors 21, 22 and 23, thereby making it possible to achieve a layout as shown in FIG. 28. The widths in the horizontal direction of the P wells in the dummy cells 31, 32 and 33 are set to be sufficiently broad so that the distances D1, D2 and D3 are greater than or equal to the width W1.

Although one dummy cell is provided for each standard cell row in FIG. 30, a plurality of dummy cells may be linked and provided together. In other words, the number of dummy cells is not limited as long as the distances D1, D2 and D3 are greater than or equal to the width W1.

Figure 31:
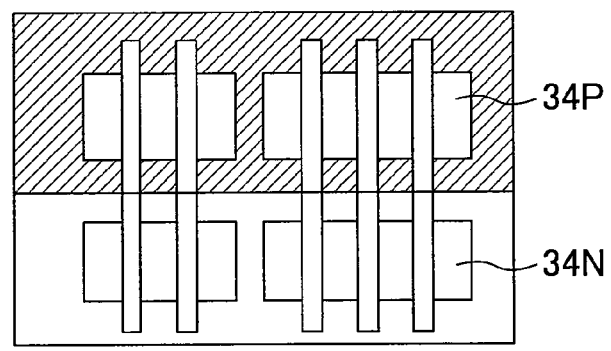
FIG. 31 is a diagram showing another exemplary configuration of a dummy cell.

FIGS. 31 to 35 show other exemplary configurations of a dummy cell. The dummy cell of FIG. 31 is a standard cell which does not share an input/output with any other standard cells. 34P indicates a PMOS transistor and 34N indicates an NMOS transistor. The dummy cell of FIG. 31 can be used as a spare circuit when a malfunction occurs in the circuit or when the circuit needs to be improved. Therefore, the efficiency of the development can be improved.

Figure 32:
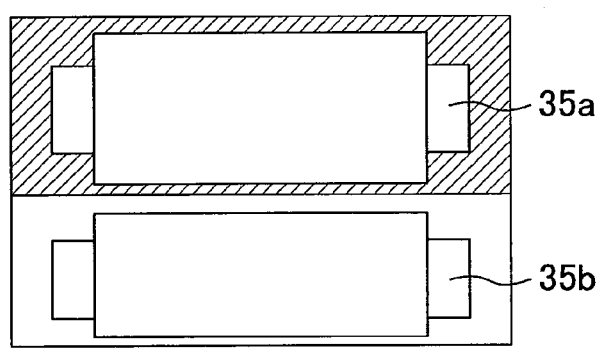
FIG. 32 is a diagram showing another exemplary configuration of a dummy cell.

The dummy cell of FIG. 32 includes inter-powerline capacitance elements 35a and 35b. By providing the dummy cell of FIG. 32, the power supply capacitance can be increased, so that the power supply noise resistance of a circuit operation can be improved.

Figure 33:
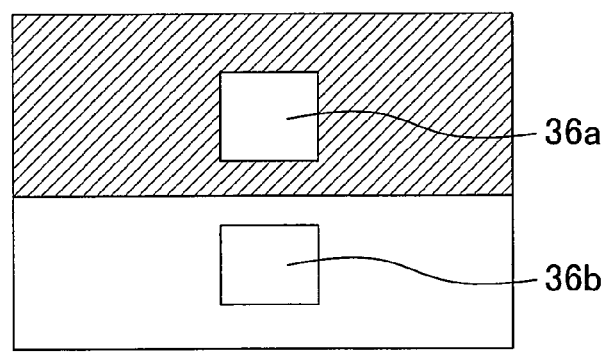
FIG. 33 is a diagram showing another exemplary configuration of a dummy cell.

The dummy cell of FIG. 33 includes diode elements 36a and 36b. By providing the dummy cell of FIG. 33, it is possible to take measures against the destruction of a gate oxide film due to the accumulation of charges in a microfabrication step, i.e., a so-called antenna effect.

Figure 34:
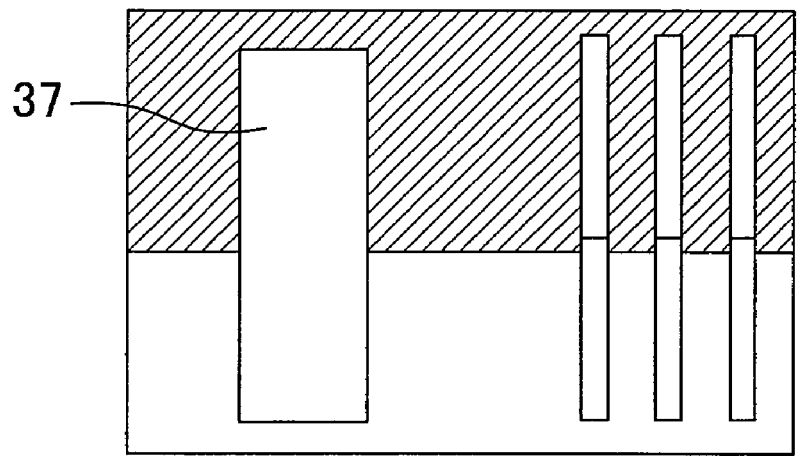
FIG. 34 is a diagram showing another exemplary configuration of a dummy cell.

The dummy cell of FIG. 34 includes a dummy gate 37 which is not connected to any other elements. By providing the dummy cell of FIG. 34, the uniformity of formation of a transistor gate wire at an endmost portion of a standard cell row can be improved, and evenness achieved by a gate wiring process can be improved.

Figure 35:
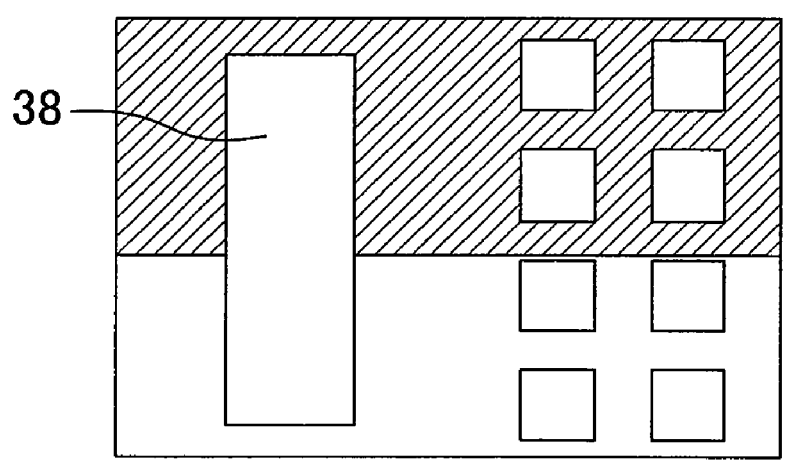
FIG. 35 is a diagram showing another exemplary configuration of a dummy cell.

The dummy cell of FIG. 35 includes a dummy wire 38 which is not connected to any other elements. By providing the dummy cell of FIG. 35, the area ratio of a wiring pattern can be adjusted, so that evenness achieved by a wiring process can be improved.

Seventh Embodiment

Figure 36:
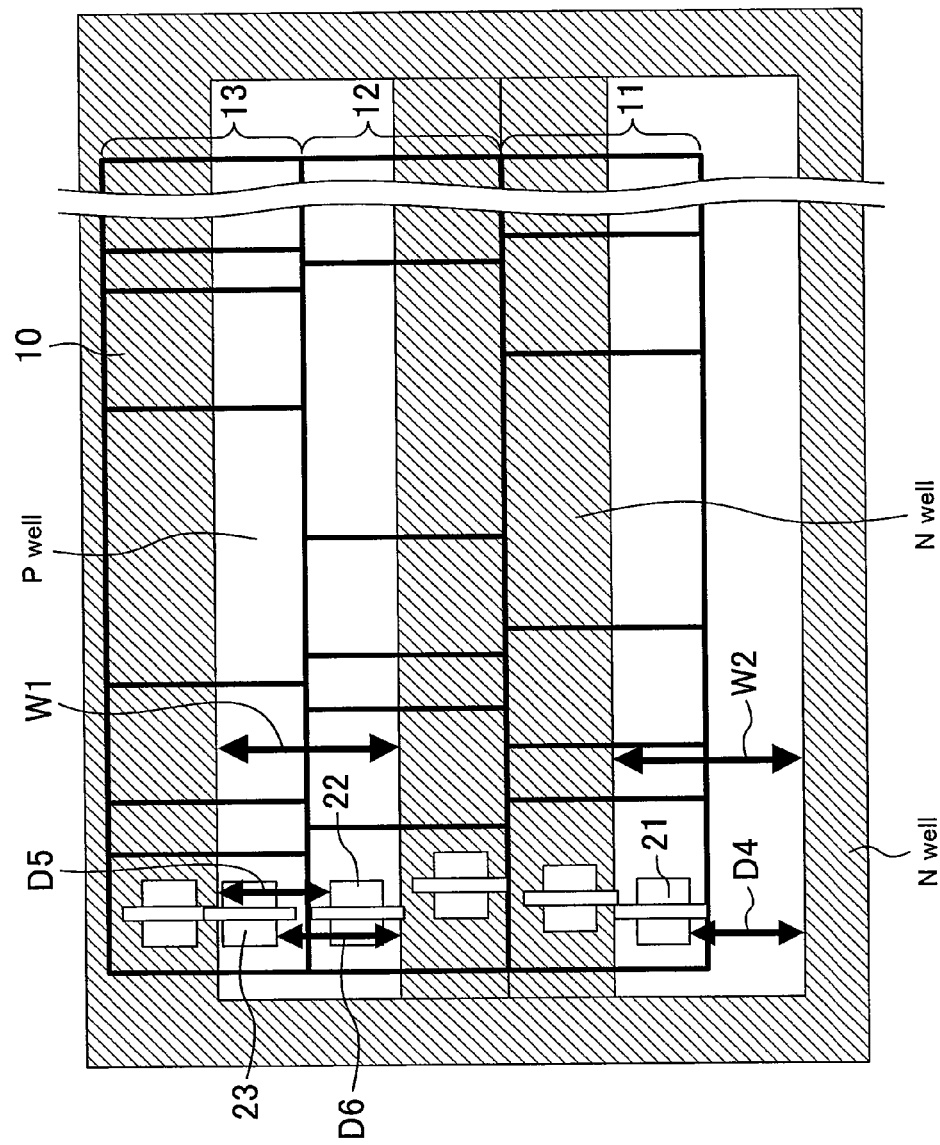
FIG. 36 is a diagram showing a portion of a layout of a semiconductor integrated circuit device according to a seventh embodiment of the present invention.

FIG. 36 is a diagram showing a portion of a layout of a semiconductor integrated circuit device according to a seventh embodiment of the present invention. The semiconductor integrated circuit device of FIG. 36 has substantially the same configuration as that of FIG. 28. The same parts are indicated by the same symbols. W2 indicates a width in the vertical direction of a P well in a first standard cell row 11.

In the semiconductor integrated circuit device of FIG. 36, the width W2 in the vertical direction of the P well in the first standard cell row 11 is broadened as compared to the conventional layout of FIG. 49. The width W2 is also greater than or equal to a width (shared-P well width) W1 in the vertical direction of a P well shared by second and third standard cell rows 12 and 13. Thereby, a distance D4 from a NMOS transistor (e.g., an NMOS transistor 21) to a farther end in the vertical direction of the P well in the first standard cell row 11 is greater than or equal to distances D5 and D6 from NMOS transistors (e.g., NMOS transistors 22 and 23) to a farther end in the vertical direction of the P well in the second and third standard cell rows 12 and 13.

With such a configuration, the well proximity effect in the first standard cell row 11 can be suppressed to substantially the same extent to which the well proximity effect in the second and third standard cell rows 12 and 13 is suppressed.

Specifically, when the distance D4 is equal to the distances D5 and D6, the amount of impurities which are reflected and scattered from a resist and are then implanted into a channel region of a transistor is substantially the same between in NMOS transistors of the first standard cell row 11 and in NMOS transistors of the second and third standard cell rows 12 and 13. Therefore, a difference in characteristics is eliminated, and a difference in circuit operation between the design stage and the actual use can be eliminated.

Also, when the distance D4 is greater than the distances D5 and D6, the amount of impurities which are reflected and scattered from a resist and are then implanted into a channel region of a transistor is larger in the NMOS transistors of the first standard cell row 11 than in the NMOS transistors of the second and third standard cell rows 12 and 13. Therefore, a difference occurs in which the NMOS transistor in the first standard cell row 11 has a reduced threshold value. In this case, however, cells provided in the first row may be more frequently used for a circuit for which a high-speed circuit operation is required, thereby making it possible to achieve a high-speed circuit.

It has been assumed above that the width of the P well in the uppermost standard cell row is broadened. Similarly, when the width of the P well in the lowermost standard cell row is broadened, an effect similar to that of this embodiment is obtained.

Figure 37:
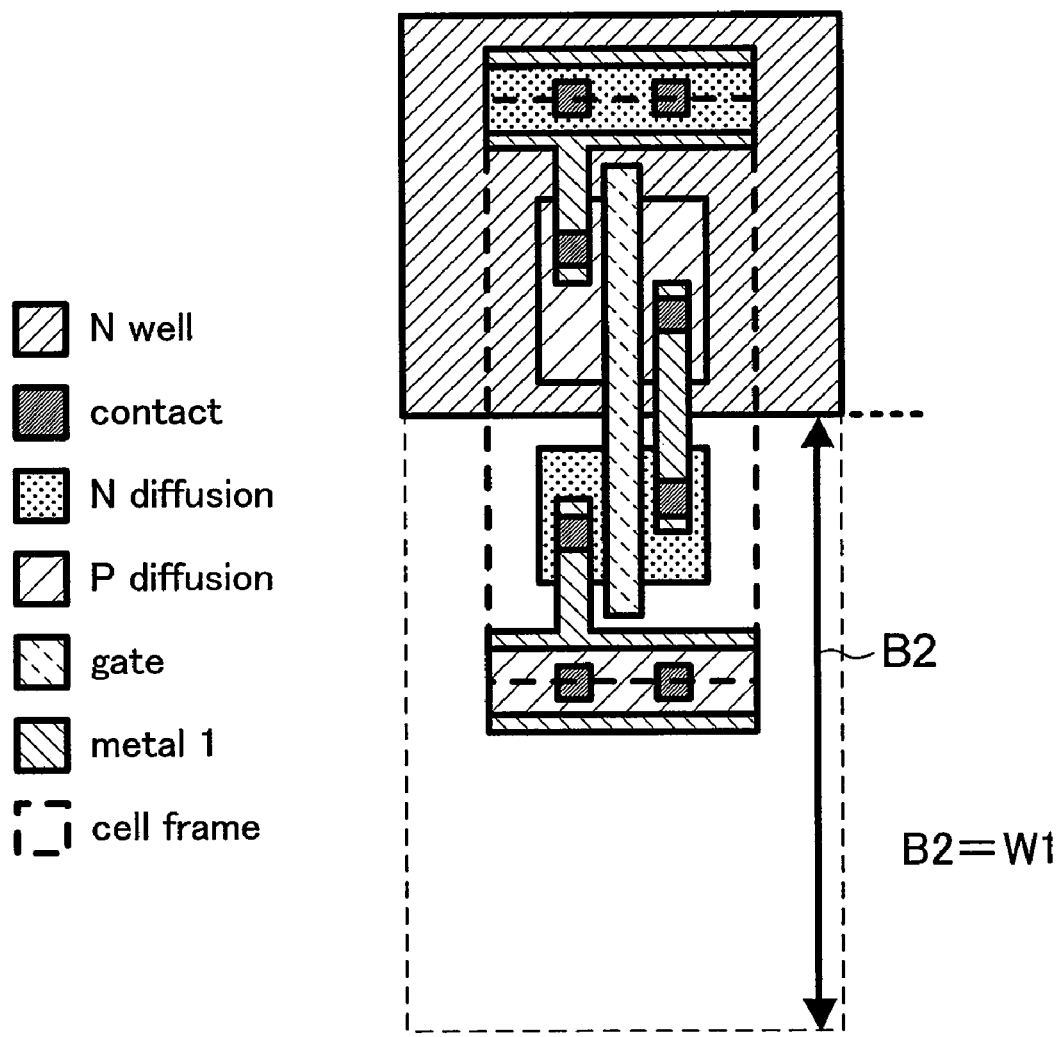
FIG. 37 is a diagram showing an exemplary standard cell for achieving the layout of FIG. 36.

FIG. 37 is a diagram showing an exemplary layout pattern of standard cells for achieving the layout of FIG. 36. The standard cell of FIG. 37 has a broader width in the vertical direction of the P well than that of the conventional standard cell of FIG. 50. In FIG. 37, B2 is the width in the vertical direction of the P well. The layout is formed so as to satisfy:

B2=W1.

In other words, the width B2 in the vertical direction of the P well is set to be the same as the shared-P well width W1 of FIG. 36.

By arranging the standard cells having a layout in which the P well is vertically broadened as shown in FIG. 37 to form each standard cell row, a layout in which the width in the vertical direction of the P well in the lowermost standard cell row is broadened as shown in FIG. 36 can be easily achieved. Note that it is assumed that, when the P well is shared by the upper and lower standard cell rows, P well regions in which a transistor is not formed overlap each other.

Figure 38:
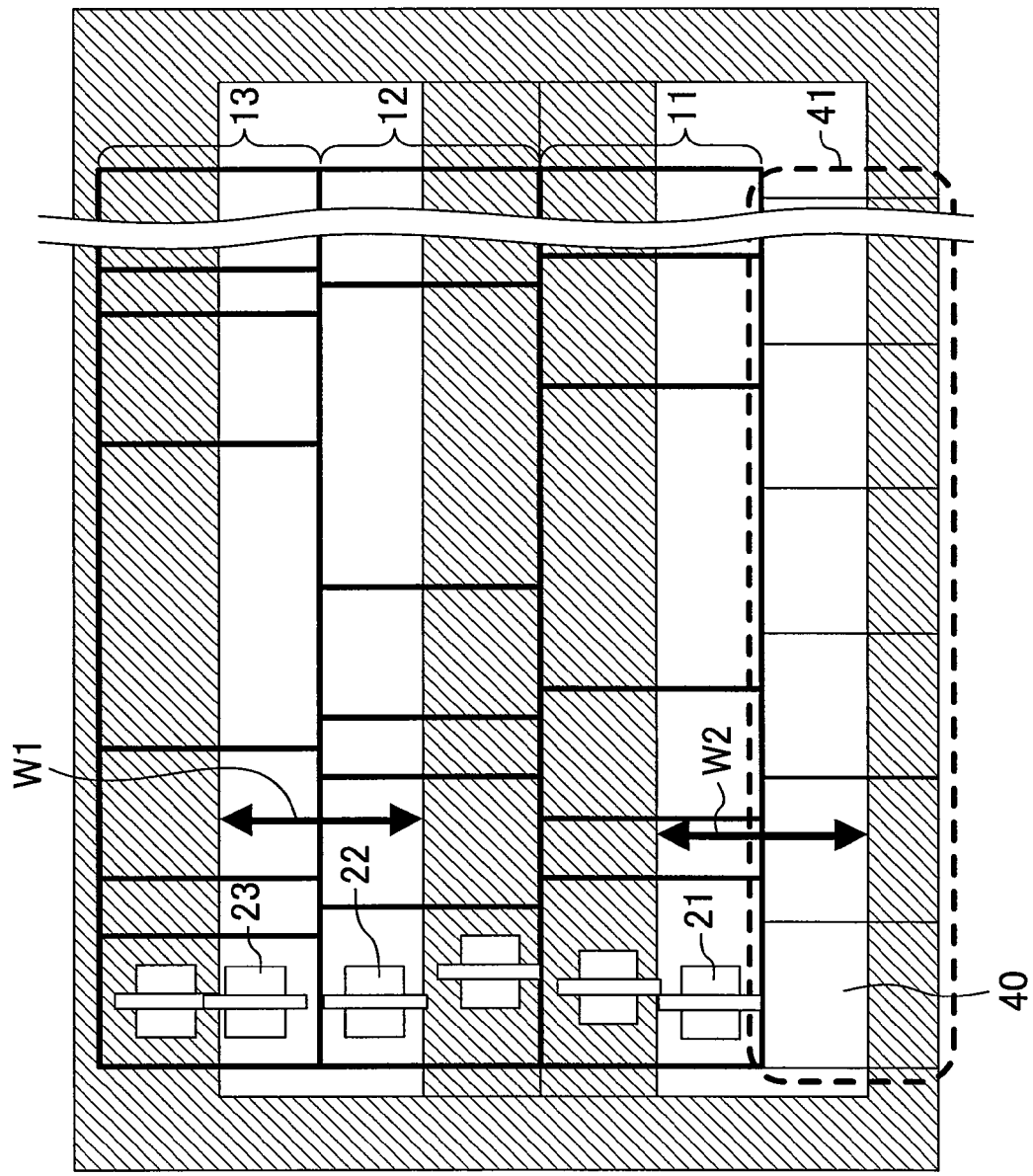
FIG. 38 is a diagram showing the layout of FIG. 36 achieved by arranging a dummy cell.
Figure 39:
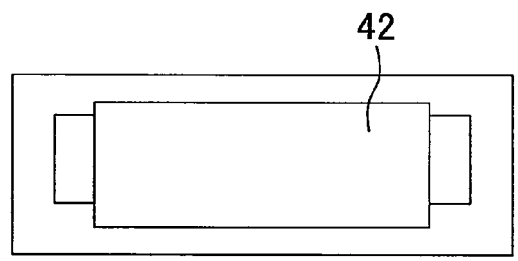
FIG. 39 is a diagram showing another exemplary configuration of a dummy cell having only a P well.

Also, a layout as shown in FIG. 36 can be achieved by providing a dummy cell row as shown in FIG. 38. In FIG. 38, a dummy cell row 41 in which dummy cells 40 each having a P well are arranged in the horizontal direction is arranged below (closer to the outside than) the first standard cell row 11 with the P well being shared with the dummy cell row 41 and the first standard cell row 11.

Instead of the dummy cell 40 of FIG. 38, dummy cells configured as shown in FIGS. 31 to 35 above may be used. In this case, an effect similar to that described above is obtained.

A cell having both an N well and a P well is used as the dummy cell 40 in FIG. 38. Instead of this, a dummy cell having only a P well without an N well may be used. In this case, an increase in layout area due to the addition of a dummy cell row is suppressed.

FIGS. 39 to 42 show other exemplary configurations of a dummy cell having only a P well. The dummy cell of FIG. 39 includes an inter-powerline capacitance element 42. By providing the dummy cell of FIG. 39, the power supply capacitance can be increased, so that the power supply noise resistance of a circuit operation can be improved.

Figure 40:
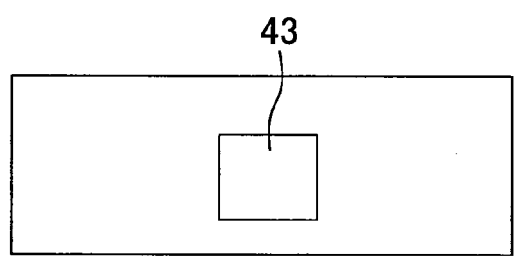
FIG. 40 is a diagram showing another exemplary configuration of a dummy cell having only a P well.

The dummy cell of FIG. 40 includes a diode element 43. By providing the dummy cell of FIG. 40, it is possible to take measures against the destruction of a gate oxide film due to the accumulation of charges in a microfabrication step, i.e., a so-called antenna effect.

Figure 41:
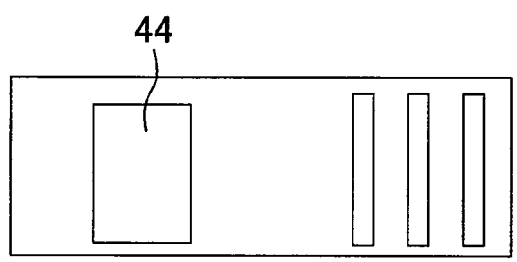
FIG. 41 is a diagram showing another exemplary configuration of a dummy cell having only a P well.

The dummy cell of FIG. 41 includes a dummy gate 44 which is not connected to any other elements. By providing the dummy cell of FIG. 41, the uniformity of formation of a transistor gate wire at an endmost portion of a standard cell row can be improved, and evenness achieved by a gate wiring process can be improved.

Figure 42:
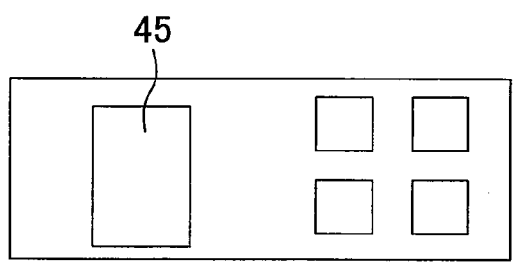
FIG. 42 is a diagram showing another exemplary configuration of a dummy cell having only a P well.

The dummy cell of FIG. 42 includes a dummy wire 45 which is not connected to any other elements. By providing the dummy cell of FIG. 42, the area ratio of a wiring pattern can be adjusted, so that evenness achieved by a wiring process can be improved.

Eighth Embodiment

Figure 43:
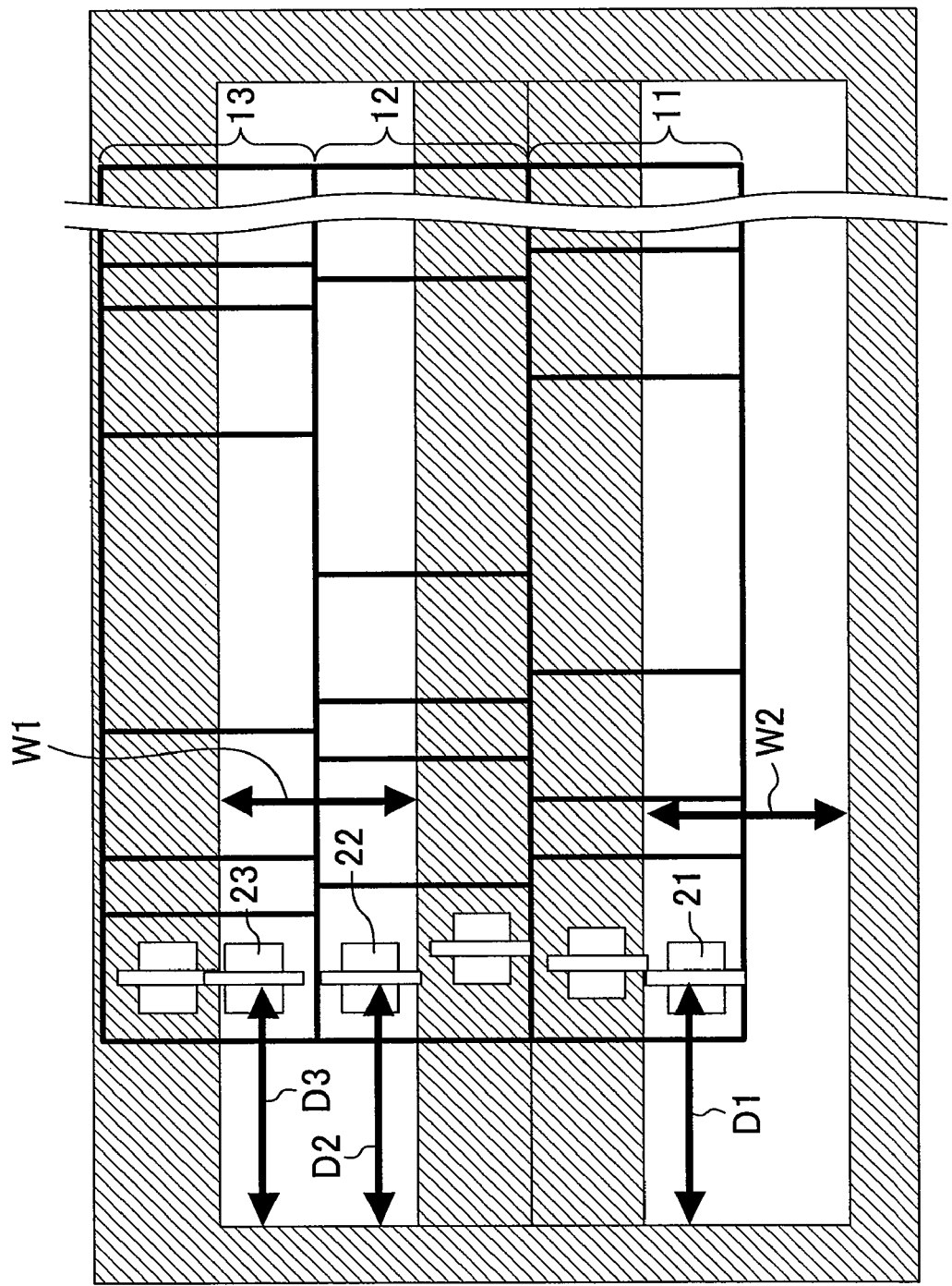
FIG. 43 is a diagram showing a portion of a layout of a semiconductor integrated circuit device according to an eighth embodiment of the present invention.

An eighth embodiment of the present invention is a combination of the sixth and seventh embodiments. FIG. 43 is a diagram showing a portion of a layout of a semiconductor integrated circuit device according to the eighth embodiment of the present invention. The semiconductor integrated circuit device of FIG. 43 has substantially the same configuration as that of FIGS. 28 and 36 and the same parts are indicated by the same symbols.

In the semiconductor integrated circuit device of FIG. 43, distances D1, D2 and D3 from NMOS transistors 21, 22 and 23 to ends of P wells are broadened to be greater than or equal to a width W1 in the vertical direction of a P well shared by second and third standard cell rows 12 and 13, as in the semiconductor integrated circuit device of FIG. 28. Also, a width W2 in the vertical direction of a P well in a first standard cell row 11 is broadened to be greater than or equal to the width W1 in the vertical direction of the P well shared by the second and third standard cell rows 12 and 13, as in the semiconductor integrated circuit device of FIG. 36.

According to this embodiment, both the operational effect obtained by the sixth embodiment and the operational effect obtained by the seventh embodiment are obtained.

Figure 44:
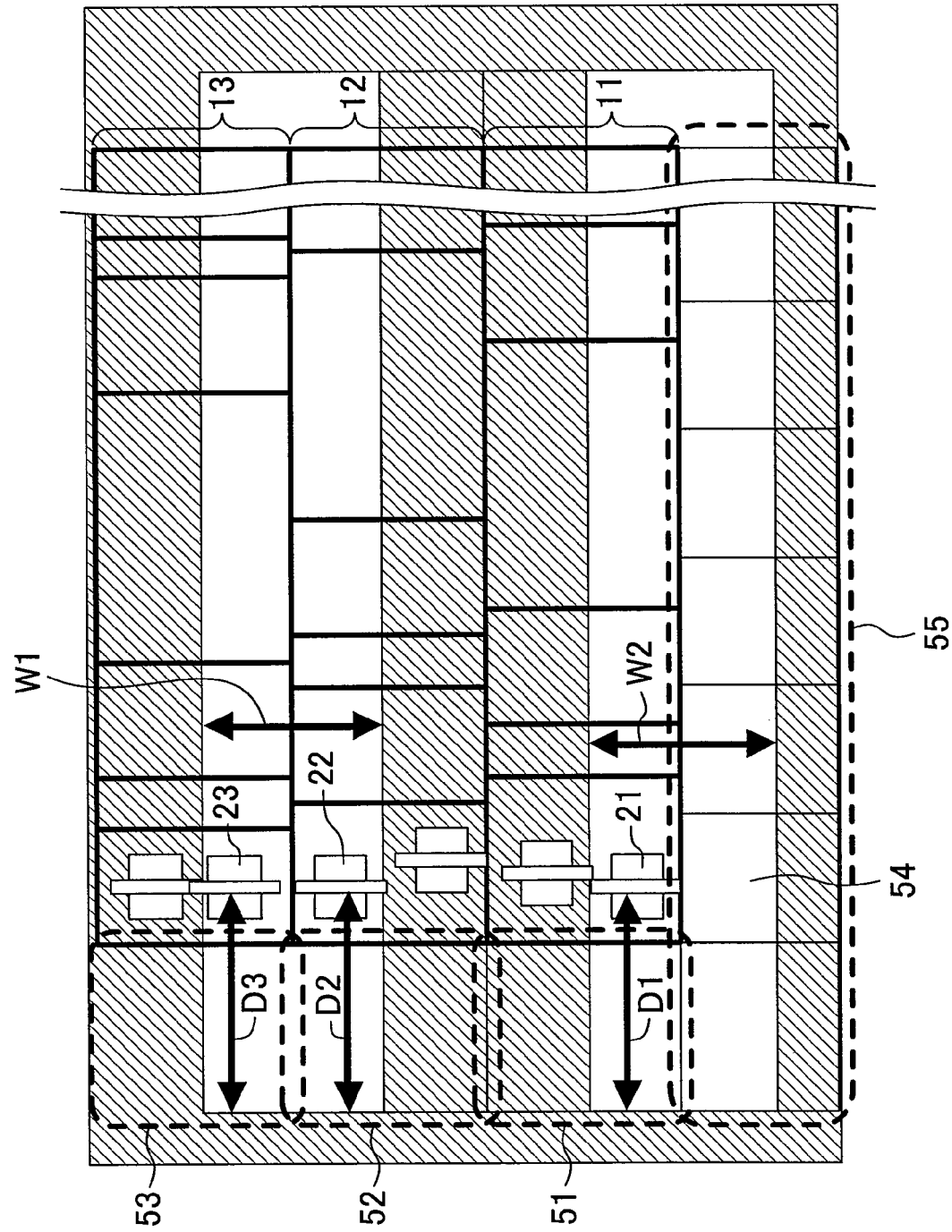
FIG. 44 is a diagram showing an exemplary standard cell for achieving the layout of FIG. 43.

Also, a layout as shown in FIG. 43 can be achieved by arranging dummy cells as shown in FIG. 44. In FIG. 44, dummy cells 51, 52 and 53 each having a P well are provided closer to the outside than the standard cells having the NMOS transistors 21, 22 and 23. Also, a dummy cell row 55 in which dummy cells 54 having a P well are arranged in the horizontal direction is provided below the first standard cell row 11 with the P well being shared with the dummy cell row 55 and the first standard cell row 11.

Ninth Embodiment

Figure 45:
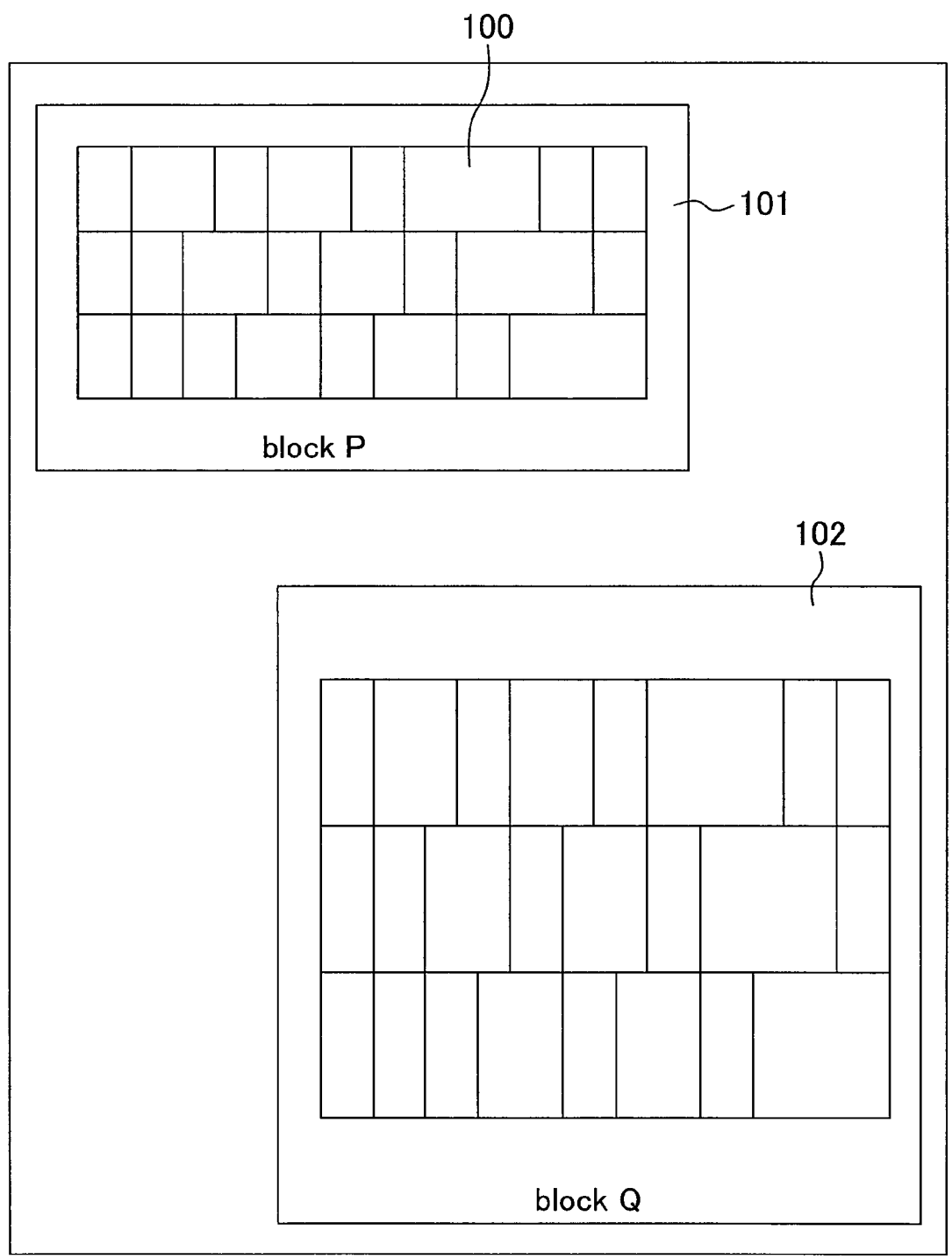
FIG. 45 is a conceptual diagram showing a semiconductor integrated circuit device according to a ninth embodiment of the present invention.

FIG. 45 is a conceptual diagram showing a semiconductor integrated circuit device according to a ninth embodiment of the present invention. The semiconductor integrated circuit device of FIG. 45 includes first and second circuit blocks 101 and 102 (a block P and a block Q) in each of which a plurality of standard cell rows in each of which standard cells 100 are arranged in the horizontal direction are arranged in the vertical direction. Note that a height in the vertical direction of a standard cell is higher in the second circuit block 102 than in the first circuit block 101.

FIGS. 46A and 46B are diagrams showing detailed layouts of the first and second circuit blocks 101 and 102 of FIG. 45, respectively. As shown in FIGS. 46A and 46B, both the first and second circuit blocks 101 and 102 have substantially the same configuration as that of the semiconductor integrated circuit device of FIG. 43.

In FIG. 46A, 61, 62 and 63 indicate standard cell rows in each of which standard cells (shown with rectangles) are arranged in the horizontal direction, and 71, 72 and 73 indicate NMOS transistors which are arranged at left ends of P wells of the standard cell rows 61, 62 and 63. E1 indicates a distance from the NMOS transistor 71 to an end closer thereto in the horizontal direction of the P well, E2 indicates a distance from the NMOS transistor 72 to an end closer thereto in the horizontal direction of the P well, and E3 indicates a distance from the PMOS transistor 73 to an end closer thereto in the horizontal direction of the P well. X1 indicates a width in the vertical direction of the P well shared by the second and third standard cell rows 62 and 63, and X2 indicates a width in the vertical direction of the P well in the first standard cell row 61.

Also, in FIG. 46B, 64, 65 and 66 indicate standard cell rows in each of which standard cells (shown with rectangles) are arranged in the horizontal direction, and 74, 75 and 76 indicate NMOS transistors which are arranged at the left ends of P wells of the standard cell rows 64, 65 and 66, respectively. E4 indicates a distance from the NMOS transistor 74 to an end closer thereto in the horizontal direction of the P well, E5 indicates a distance from the NMOS transistor 75 to an end closer thereto in the horizontal direction of the P well, and E6 indicates a distance from the NMOS transistor 76 to an end closer thereto in the horizontal direction of the P well. X3 indicates a width in the vertical direction of the P well shared by the second and third standard cell rows 65 and 66, and X4 indicates a width in the vertical direction of the P well in the first standard cell row 64.

As shown in FIG. 46A, in the first circuit block 101, the width X2 in the vertical direction of the P well in the first standard cell row 61 is greater than or equal to the width X1 in the vertical direction of the P well shared by the second and third standard cell rows 62 and 63. As shown in FIG. 46B, in the second circuit block 102, the width X4 in the vertical direction of the P well in the first standard cell row 64 is greater than or equal to the width X3 in the vertical direction of the P well shared by the second and third standard cell rows 65 and 66.

With such a configuration, an operational effect similar to that of the seventh embodiment is obtained in the first and second circuit blocks 101 and 102. Specifically, in the first circuit block 101, a difference or a deterioration in characteristics does not occur in the NMOS transistors of the first standard cell row 61, as compared to the NMOS transistors of the second and third standard cell rows 62 and 63. Also, in the second circuit block 102, a difference or a deterioration in characteristics does not occur in the NMOS transistors of the first standard cell row 64, as compared to the NMOS transistors of the second and third standard cell rows 65 and 66.

Also, as shown in FIG. 46A, in the first circuit block 101, the distances E1, E1 and E3 from the NMOS transistors 71, 72 and 73 to the ends of the P wells are broadened. The distances E1, E2 and E3 are greater than or equal to the width X1 in the vertical direction of the P well shared by the second and third standard cell rows 62 and 63. Thereby, an operational effect similar to that of the sixth embodiment is obtained.

Also, as shown in FIG. 46B, in the second circuit block 102, the distances E4, E5 and E6 from the NMOS transistors 74, 75 and 76 to the ends of the P well are broadened. Note that, in this case, the distances E4, E5 and E6 may be greater than or equal to the width X1 in the vertical direction of the P well shared by the second and third standard cell rows 62 and 63 in the first circuit block 101. Thereby, an operational effect similar to that of the sixth embodiment is obtained.

Specifically, in a semiconductor integrated circuit device having a plurality of circuit blocks having different cell heights, a width in the horizontal direction of a P well may be broadened with reference to a width of a shared P well in a circuit block having a smaller cell height.

Although the distance from the NMOS transistor located at the left end of each standard cell row to the left end of the P well is broadened in FIGS. 46A and 46B, the distance from the NMOS transistor located at the right end to the right end of the P well may be broadened, or the distances from the NMOS transistors located at both the left and right ends to the left and right ends of the P wells may be broadened.

Although the distance from the NMOS transistor located at the end to the end of the P well is broadened in all of the standard cell rows in FIGS. 46A and 46B, the distance may be broadened in at least one of the standard cell rows, which is included in the present invention.

Tenth Embodiment

Figure 47:
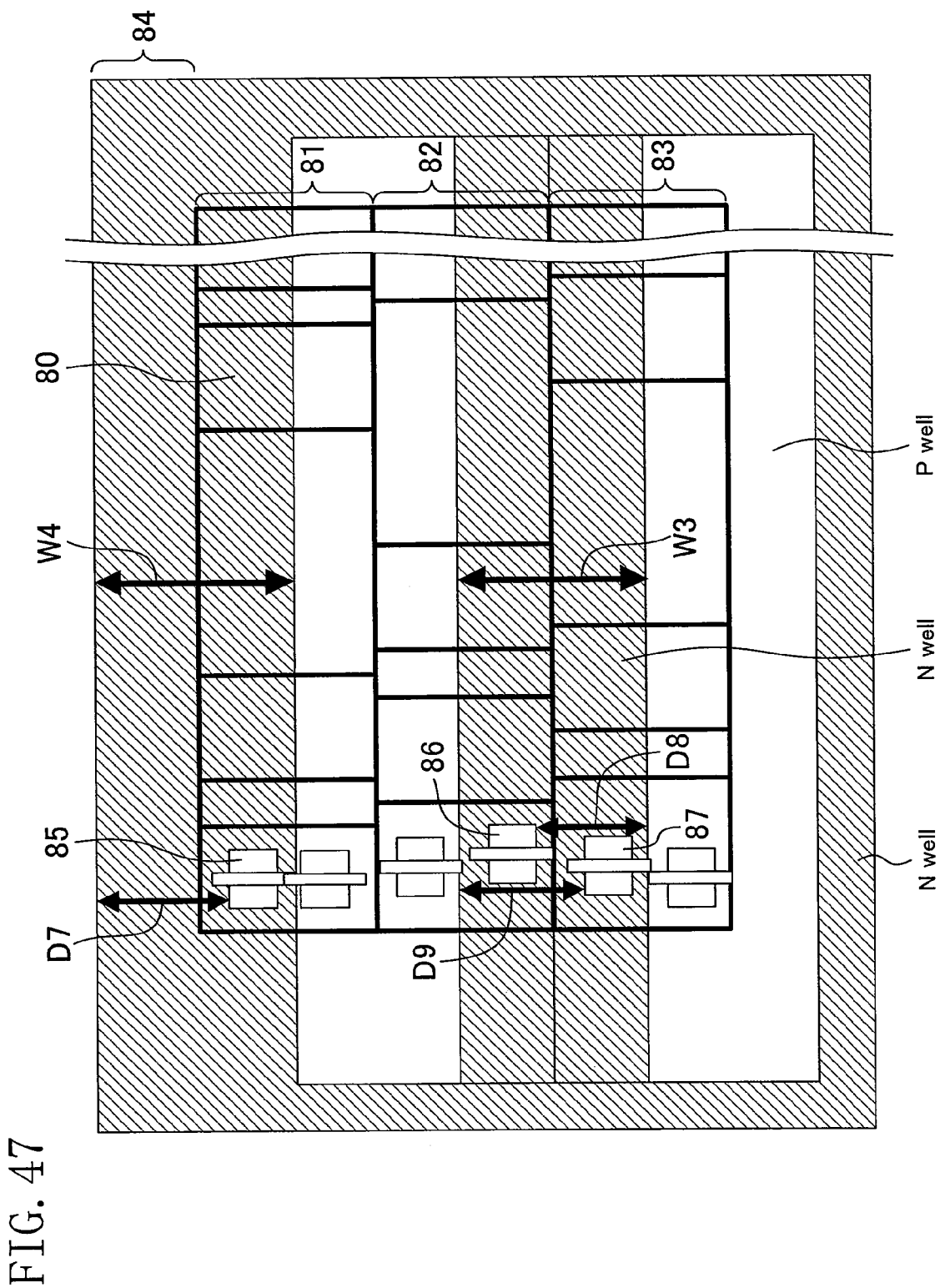
FIG. 47 is a diagram showing a portion of a layout of a semiconductor integrated circuit device according to a tenth embodiment of the present invention.
Figure 48:
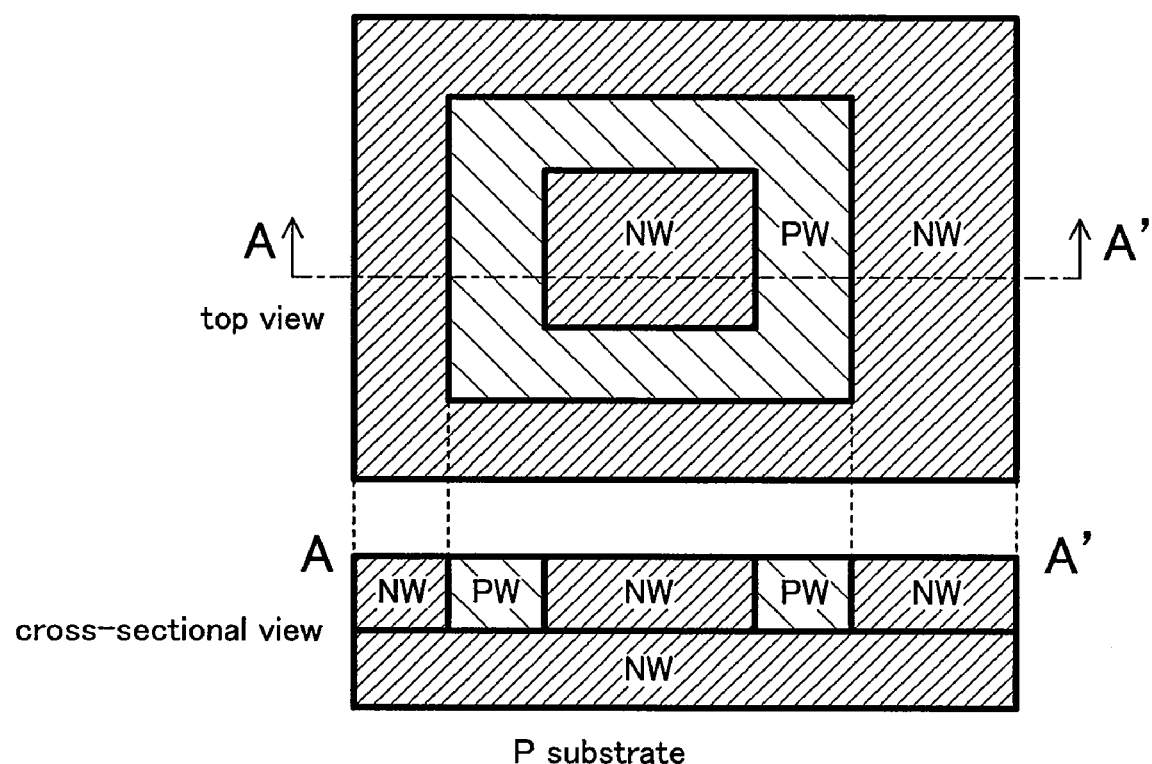
FIG. 48 is a diagram schematically showing a triple-well structure.

FIG. 47 is a diagram showing a portion of a layout of a semiconductor integrated circuit device according to a tenth embodiment of the present invention. In FIG. 47, 81, 82 and 83 indicate standard cell rows in which standard cells 80 (shown with rectangles) are arranged in the horizontal direction. The standard cell rows 81, 82, 83, . . . are arranged in the vertical direction to form a circuit block. The standard cell row 81 is the uppermost row. Each of the standard cell rows 81, 82 and 83 includes an N well and a P well which extend in the horizontal direction and are adjacent to each other in the vertical direction. Each standard cell 80 has a PMOS transistor formed in the N well and an NMOS transistor formed in the P well. Note that transistors other than the NMOS transistors 85, 86 and 87 and some NMOS transistors are not shown.

The semiconductor integrated circuit device of FIG. 47 has a triple-well structure in which PMOS transistors are formed on an N well and NMOS transistors are formed on a P well, and the N well and the P well are formed on a deep N well (triple well).

In the standard cell rows 81, 82 and 83, positions in the vertical direction of the N well and the P well are switched every other row. Specifically, the standard cell row 82 is flipped. Also, as viewed from the top, the first and second standard cell rows 81 and 82 share the P well, and the second and third standard cell rows 82 and 83 share the N well.

84 indicates an N well (triple well) which is formed closer to the outside than the N well of the first standard cell row 81. W3 indicates a width in the vertical direction of the N well shared by the second and third standard cell rows 82 and 83, and W4 indicates a width in the vertical direction of an N well which is a combination of the N well of the first standard cell row 81 and the N well 84.

In FIG. 47, the N well (triple well) 84 is arranged so that the width W4 in the vertical direction of the N well which is a combination of the N well of the first standard cell row 81 and the N well 84 is greater than or equal to the width W3 in the vertical direction of the N well shared by the second and third standard cell rows 82 and 83. Thereby, a distance D7 from a PMOS transistor (e.g., a PMOS transistor 85) to a farther end in the vertical direction of the N well in the first standard cell row 81 is greater than or equal to distances D8 and D9 from PMOS transistors (e.g., PMOS transistors 86 and 87) to a farther end in the vertical direction of the N well in the second and third standard cell rows 82 and 83. Therefore, a difference or a deterioration in characteristics is less likely to occur in the PMOS transistors of the first standard cell row 81 than in the PMOS transistors of the second and third standard cell rows 82 and 83.

It has been assumed above that the width of the N well in the uppermost standard cell row is broadened. Similarly, when the width of the N well in the lowermost standard cell row is broadened, an effect similar to that of this embodiment is obtained.

Although the P well is also broadened in the horizontal and vertical directions in FIG. 47 as described in the embodiments above, an effect similar to that of this embodiment is also obtained even if the P well is not broadened.

The present invention can suppress variations in transistor characteristics due to the well proximity effect, and therefore, is useful as a technique for achieving an improvement in yield, an improvement in circuit performance, and a reduction in block area of a semiconductor integrated circuit device, for example.

What is claimed is:

1. A semiconductor integrated circuit device comprising:
a circuit block including a plurality of standard cell rows arranged in a vertical direction, each standard cell row including standard cells arranged in a horizontal direction,
wherein each of the standard cell rows includes an N well and a P region extending in the horizontal direction and adjacent to each other in the vertical direction,
each of the standard cells has a PMOS transistor formed in the N well and an NMOS transistor formed in the P region,
in the standard cell rows, positions of the N well and the P region in the vertical direction are switched every other row, the first and second standard cell rows share the P region, and the second and third standard cell rows share the N well,
in at least one of the standard cell rows, a distance from a PMOS transistor located at least one end thereof to an end closer to the PMOS transistor in the horizontal direction of the N well is greater than or equal to a shared-N well width which is a width in the vertical direction of the N well shared by the second and third standard cell rows.

2. The semiconductor integrated circuit device of claim 1, wherein
in the at least one standard cell row, each of the standard cells has a distance in the horizontal direction from the PMOS transistor to an end of the N well, the distance being greater than or equal to the shared-N well width.

3. The semiconductor integrated circuit device of claim 1, wherein
in the at least one standard cell row, a dummy cell having an N well is arranged closer to the outside than the standard cell having the PMOS transistor.

4. The semiconductor integrated circuit device of claim 3, wherein
the dummy cell is a standard cell which does not share an input/output with any other standard cells.

5. The semiconductor integrated circuit device of claim 3, wherein
the dummy cell includes an inter-powerline capacitance element, a diode element, a dummy gate which is not connected to any other elements, or a dummy wire which is not connected to any other elements.

6. The semiconductor integrated circuit device of claim 1, wherein
a width in the vertical direction of the N well in the first standard cell row is greater than or equal to the shared-N well width.

7. The semiconductor integrated circuit device of claim 1, wherein
the P region is a P well.

8. A semiconductor integrated circuit device comprising:
a first circuit block and a second circuit block each including a plurality of standard cell rows arranged in a vertical direction, each standard cell row including standard cells arranged in a horizontal direction, wherein each of the standard cell rows includes an N well and a P region extending in the horizontal direction and adjacent to each other in the vertical direction, each of the standard cells has a PMOS transistor formed in the N well and an NMOS transistor formed in the P region, in the standard cell rows of each of the first and second circuit block, positions of the N well and the P region in the vertical direction are switched every other row, the first and second standard cell rows share the P region, and the second and third standard cell rows share the N well, a height in the vertical direction of the standard cell in the second circuit block is greater than a height in the vertical direction of the standard cell in the first circuit block, in at least one of the standard cell rows in the second circuit block, a distance from a PMOS transistor located at least one end thereof to an end closer to the PMOS transistor in the horizontal direction of the N well is greater than or equal to a width in the vertical direction of the N well shared by the second and third standard cell rows in the first circuit block.

9. A semiconductor integrated circuit device comprising:

a circuit block including a plurality of standard cell rows arranged in a vertical direction, each standard cell row including standard cells arranged in a horizontal direction, wherein each of the standard cell rows includes an N well and a P region extending in the horizontal direction and adjacent to each other in the vertical direction, each of the standard cells has a PMOS transistor formed in the N well and an NMOS transistor formed in the P region, in the standard cell rows, positions of the N well and the P region in the vertical direction are switched every other row, the first and second standard cell rows share the P region, and the second and third standard cell rows share the N well, a width in the vertical direction of the N well in the first standard cell row is greater than or equal to a shared-N well width which is a width in the vertical direction of the N well shared by the second and third standard cell rows, and each of the standard cells has a width in the vertical direction of the N well greater than or equal to the shared-N well width.

10. A semiconductor integrated circuit device comprising:

a circuit block including a plurality of standard cell rows arranged in a vertical direction, each standard cell row including standard cells arranged in a horizontal direction, wherein each of the standard cell rows includes an N well and a P region extending in the horizontal direction and adjacent to each other in the vertical direction, each of the standard cells has a PMOS transistor formed in the N well and an NMOS transistor formed in the P region, in the standard cell rows, positions of the N well and the P region in the vertical direction are switched every other row, the first and second standard cell rows share the P region, and the second and third standard cell rows share the N well, a dummy cell row having dummy cells arranged in the horizontal direction, each dummy cell having an N well, is arranged closer to the outside than the first standard cell row with the N well being shared with the dummy cell row and the first standard cell row, and a width in the vertical direction of the N well shared by the first standard cell row and the dummy cell row is greater than or equal to a shared-N well width which is a width in the vertical direction of the N well shared by the second and third standard cell rows.

11. The semiconductor integrated circuit device of claim 10, wherein the dummy cell is a standard cell which does not share an input/output with any other standard cells.

12. The semiconductor integrated circuit device of claim 10, wherein the dummy cell includes an inter-powerline capacitance element, a diode element, a dummy gate which is not connected to any other elements, or a dummy wire which is not connected to any other elements.

13. The semiconductor integrated circuit device of claim 10, wherein the dummy cell does not have a P region.

14. A semiconductor integrated circuit device comprising:

a circuit block including a plurality of standard cell rows arranged in a vertical direction, each standard cell row including standard cells arranged in a horizontal direction, wherein each of the standard cell rows includes an N well and a P well extending in the horizontal direction and adjacent to each other in the vertical direction, each of the standard cells has a PMOS transistor formed in the N well and an NMOS transistor formed in the P well, in the standard cell rows, positions of the N well and the P well in the vertical direction are switched every other row, the first and second standard cell rows share the N well, and the second and third standard cell rows share the P well, and a width in the vertical direction of the P well in the first standard cell row is greater than or equal to a width in the vertical direction of the P well shared by the second and third standard cell rows.

15. The semiconductor integrated circuit device of claim 14, wherein a dummy cell row having dummy cells arranged in the horizontal direction is arranged closer to the outside than the first standard cell row with the P well being shared with the dummy cell row and the first standard cell row.

16. A semiconductor integrated circuit device comprising:

a circuit block including a plurality of standard cell rows arranged in a vertical direction, each standard cell row including standard cells arranged in a horizontal direction, wherein each of the standard cell rows includes an N well and a P well extending in the horizontal direction and adjacent to each other in the vertical direction, each of the standard cells has a PMOS transistor formed in the N well and an NMOS transistor formed in the P well, in the standard cell rows, positions of the N well and the P well in the vertical direction are switched every other row, the first and second standard cell rows share the N well, and the second and third standard cell rows share the P well, and in at least one of the standard cell rows, a distance from an NMOS transistor located at least one end thereof to an end closer to the NMOS transistor in the horizontal direction of the P well is greater than or equal to a shared-P well width which is a width in the vertical direction of the P well shared by the second and third standard cell rows.

17. The semiconductor integrated circuit device of claim 16, wherein the N well and the P well possessed by each of the standard cell rows are formed on a triple well which is an N well.

18. The semiconductor integrated circuit device of claim 16, wherein in the at least one standard cell row, each of the standard cells has a distance in the horizontal direction from the NMOS transistor to an end of the P well, the distance being greater than or equal to the shared-P well width.

19. The semiconductor integrated circuit device of claim 16, wherein
in the at least one standard cell row, a dummy cell having a P well is arranged closer to the outside than the standard cell having the PMOS transistor.

20. The semiconductor integrated circuit device of claim 19, wherein
the dummy cell is a standard cell which does not share an input/output with any other standard cells.

21. The semiconductor integrated circuit device of claim 19, wherein
the dummy cell includes an inter-powerline capacitance element, a diode element, a dummy gate which is not connected to any other elements, or a dummy wire which is not connected to any other elements.

22. The semiconductor integrated circuit device of claim 16, wherein
a width in the vertical direction of the P well in the first standard cell row is greater than or equal to the shared-P well width.

23. A semiconductor integrated circuit device comprising:
a first circuit block and a second circuit block each including a plurality of standard cell rows arranged in a vertical direction, each standard cell row including standard cells arranged in a horizontal direction,
wherein each of the standard cell rows includes an N well and a P well extending in the horizontal direction and adjacent to each other in the vertical direction,
each of the standard cells has a PMOS transistor formed in the N well and an NMOS transistor formed in the P well,
in the standard cell rows of each of the first and second circuit block, positions of the N well and the P well in the vertical direction are switched every other row, the first and second standard cell rows share the N well, and the second and third standard cell rows share the P well,
a height in the vertical direction of the standard cell in the second circuit block is greater than a height in the vertical direction of the standard cell in the first circuit block,
in at least one of the standard cell rows in the second circuit block, a distance from an NMOS transistor located at least one end thereof to an end closer to the NMOS transistor in the horizontal direction of the P well is greater than or equal to a width in the vertical direction of the P well shared by the second and third standard cell rows in the first circuit block.

24. A semiconductor integrated circuit device comprising:
a circuit block including a plurality of standard cell rows arranged in a vertical direction, each standard cell row including standard cells arranged in a horizontal direction,
wherein each of the standard cell rows includes an N well and a P well extending in the horizontal direction and adjacent to each other in the vertical direction,
each of the standard cells has a PMOS transistor formed in the N well and an NMOS transistor formed in the P well,
in the standard cell rows, positions of the N well and the P well in the vertical direction are switched every other row, the first and second standard cell rows share the N well, and the second and third standard cell rows share the P well,
a width in the vertical direction of the P well in the first standard cell row is greater than or equal to a shared-P well width which is a width in the vertical direction of the P well shared by the second and third standard cell rows, and
each of the standard cells has a width in the vertical direction of the P well greater than or equal to the shared-P well width.

25. A semiconductor integrated circuit device comprising:
a circuit block including a plurality of standard cell rows arranged in a vertical direction, each standard cell row including standard cells arranged in a horizontal direction,
wherein each of the standard cell rows includes an N well and a P well extending in the horizontal direction and adjacent to each other in the vertical direction,
each of the standard cells has a PMOS transistor formed in the N well and an NMOS transistor formed in the P well,
in the standard cell rows, positions of the N well and the P well in the vertical direction are switched every other row, the first and second standard cell rows share the N well, and the second and third standard cell rows share the P well,
a dummy cell row having dummy cells arranged in the horizontal direction, each dummy cell having a P well, is arranged closer to the outside than the first standard cell row with the P well being shared with the dummy cell row and the first standard cell row, and
a width in the vertical direction of the P well shared by the first standard cell row and the dummy cell row is greater than or equal to a shared-P well width which is a width in the vertical direction of the P well shared by the second and third standard cell rows.

26. The semiconductor integrated circuit device of claim 25, wherein
the dummy cell is a standard cell which does not share an input/output with any other standard cells.

27. The semiconductor integrated circuit device of claim 25, wherein
the dummy cell includes an inter-powerline capacitance element, a diode element, a dummy gate which is not connected to any other elements, or a dummy wire which is not connected to any other elements.

28. The semiconductor integrated circuit device of claim 25, wherein
the dummy cell does not have an N well.

29. A semiconductor integrated circuit device comprising:
a circuit block including a plurality of standard cell rows arranged in a vertical direction, each standard cell row including standard cells arranged in a horizontal direction,
wherein each of the standard cell rows includes an N well and a P well extending in the horizontal direction and adjacent to each other in the vertical direction,
the N well and the P well possessed by each of the standard cell rows are formed on a triple well which is an N well,
each of the standard cells has a PMOS transistor formed in the N well and an NMOS transistor formed in the P well,
in the standard cell rows, positions of the N well and the P well in the vertical direction are switched every other row, the first and second standard cell rows share the P well, and the second and third standard cell rows share the N well, and
a width in the vertical direction of an N well which is a combination of the N well of the first standard cell row and the triple-well formed outside the N well of the first standard cell row is greater than or equal to a width in the vertical direction of the N well shared by the second and third standard cell rows.

* * * * *